(12) United States Patent
Wakimoto et al.

(10) Patent No.: US 11,646,350 B2
(45) Date of Patent: May 9, 2023

(54) SEMICONDUCTOR DEVICE, AND METHOD OF MANUFACTURING SEMICONDUCTOR DEVICE

(71) Applicant: FUJI ELECTRIC CO., LTD., Kanagawa (JP)

(72) Inventors: Hiroki Wakimoto, Matsumoto (JP); Hiroshi Takishita, Matsumoto (JP); Takashi Yoshimura, Matsumoto (JP); Takahiro Tamura, Matsumoto (JP); Yuichi Onozawa, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 17/168,124

(22) Filed: Feb. 4, 2021

(65) Prior Publication Data
US 2021/0159317 A1    May 27, 2021

Related U.S. Application Data

(60) Continuation of application No. 16/430,444, filed on Jun. 4, 2019, now Pat. No. 10,923,570, which is a
(Continued)

(30) Foreign Application Priority Data

Oct. 3, 2014    (JP) .............................. JP2014-204849

(51) Int. Cl.
*H01L 29/36*  (2006.01)
*H01L 29/66*  (2006.01)
(Continued)

(52) U.S. Cl.
CPC ............ *H01L 29/36* (2013.01); *H01L 21/221* (2013.01); *H01L 21/265* (2013.01);
(Continued)

(58) Field of Classification Search
CPC ... H01L 21/265; H01L 21/324; H01L 21/221; H01L 29/0638; H01L 29/32;
(Continued)

(56) References Cited

U.S. PATENT DOCUMENTS 3,645,808 A    2/1972    Kamiyama
4,047,976 A    9/1977    Bledsoe
(Continued)

FOREIGN PATENT DOCUMENTS

CN    104040692 A    9/2014
JP    H7-193218 A    7/1995
(Continued)

OTHER PUBLICATIONS

International Search Report for International Application No. PCT/JP2015/072933, issued by the Japan Patent Office dated Oct. 6, 2015.
(Continued)

*Primary Examiner* — Shahed Ahmed

(57) ABSTRACT

A p-type semiconductor region is formed in a front surface side of an n-type semiconductor substrate. An n-type field stop (FS) region including protons as a donor is formed in a rear surface side of the semiconductor substrate. A concentration distribution of the donors in the FS region include first, second, third and fourth peaks in order from a front surface to the rear surface. Each of the peaks has a peak maximum point, and peak end points formed at both sides of the peak maximum point. The peak maximum points of the first and second peaks are higher than the peak maximum point of the third peak. The peak maximum point of the third peak is lower than the peak maximum point of the fourth peak.

20 Claims, 31 Drawing Sheets

Related U.S. Application Data division of application No. 15/169,740, filed on Jun. 1, 2016, now Pat. No. 10,312,331, which is a continuation of application No. PCT/JP2015/072933, filed on Aug. 13, 2015.

(51) Int. Cl.

| | | |
|---|---|---|
| *H01L 29/32* | (2006.01) | |
| *H01L 29/861* | (2006.01) | |
| *H01L 21/22* | (2006.01) | |
| *H01L 21/265* | (2006.01) | |
| *H01L 21/324* | (2006.01) | |
| *H01L 29/06* | (2006.01) | |
| *H01L 29/739* | (2006.01) | |
| *H01L 27/06* | (2006.01) | |

(52) U.S. Cl.
CPC ........ *H01L 21/324* (2013.01); *H01L 29/0638* (2013.01); *H01L 29/32* (2013.01); *H01L 29/6609* (2013.01); *H01L 29/66128* (2013.01); *H01L 29/66348* (2013.01); *H01L 29/7397* (2013.01); *H01L 29/861* (2013.01); *H01L 29/8611* (2013.01); *H01L 21/26506* (2013.01); *H01L 27/0664* (2013.01); *H01L 29/0619* (2013.01)

(58) Field of Classification Search
CPC .......... H01L 29/6609; H01L 29/66128; H01L 29/66348; H01L 29/7397; H01L 29/861; H01L 29/8611; H01L 21/26506; H01L 27/0664; H01L 29/0619; H01L 2924/12036; H01L 29/66136; H01L 29/36–365
See application file for complete search history.

(56) References Cited

U.S. PATENT DOCUMENTS

| | | | |
|---|---|---|---|
| 4,203,780 A | 5/1980 | Matsushita | |
| 4,370,180 A | 1/1983 | Azuma | |
| 4,594,602 A | 6/1986 | Iimura et al. | |
| 4,651,189 A | 3/1987 | Yatsuo | |
| 4,713,679 A | 12/1987 | Terasawa | |
| 4,855,799 A | 8/1989 | Tanabe | |
| 4,925,812 A | 5/1990 | Gould | |
| 4,963,509 A | 10/1990 | Yoshizawa | |
| 4,972,239 A | 11/1990 | Mihara | |
| 5,023,696 A | 6/1991 | Ogino | |
| 5,250,446 A | 10/1993 | Osawa | |
| 5,304,821 A | 4/1994 | Hagino | |
| 5,342,805 A | 8/1994 | Chan | |
| 5,389,815 A | 2/1995 | Takahashi | |
| 5,432,360 A | 7/1995 | Kim | |
| 5,608,244 A | 3/1997 | Takahashi | |
| 5,717,244 A | 2/1998 | Soejima | |
| 5,808,352 A | 9/1998 | Sakamoto | |
| 5,900,652 A | 5/1999 | Battaglia | |
| 6,054,748 A | 4/2000 | Tsukuda | |
| 6,100,575 A | 8/2000 | Minato | |
| 6,175,143 B1 | 1/2001 | Fujihira | |
| 6,188,109 B1 | 2/2001 | Takahashi | |
| 6,346,740 B1 | 2/2002 | Iwamuro | |
| 6,482,681 B1 | 11/2002 | Francis et al. | |
| 6,610,572 B1 | 8/2003 | Takei | |
| 6,707,111 B2 | 3/2004 | Francis et al. | |
| 6,803,609 B1 | 10/2004 | Werner | |
| 7,799,662 B2 | 9/2010 | Nemoto | |
| 8,163,630 B2* | 4/2012 | Nemoto | H01L 29/861 438/513 |
| 8,766,413 B2 | 7/2014 | Nemoto et al. | |
| 9,035,434 B2 | 5/2015 | Nakamura | |
| 9,070,737 B2 | 6/2015 | Lu | |
| 9,129,851 B2 | 9/2015 | Kouno | |
| 9,276,071 B2 | 3/2016 | Yoshimura | |
| 9,299,698 B2 | 3/2016 | Zhao | |
| 9,299,801 B1 | 3/2016 | Bakhishev | |
| 9,356,115 B2 | 5/2016 | Mizushima | |
| 9,490,128 B2 | 11/2016 | Wang | |
| 9,768,285 B1 | 9/2017 | Kuruc | |
| 9,818,696 B1 | 11/2017 | Fukunaga | |
| 9,941,361 B2 | 4/2018 | Nishio | |
| 9,954,053 B2 | 4/2018 | Onozawa | |
| 9,954,086 B2 | 4/2018 | Onozawa | |
| 10,026,831 B2 | 7/2018 | Muramatsu | |
| 10,083,843 B2 | 9/2018 | Hawryluk | |
| 10,170,559 B1 | 1/2019 | Hongyong | |
| 10,193,000 B1 | 1/2019 | Wisotzki | |
| 10,418,441 B2 | 9/2019 | Naito | |
| 2001/0005036 A1 | 6/2001 | Porst | |
| 2001/0054738 A1 | 12/2001 | Momota | |
| 2002/0061661 A1 | 5/2002 | Dairiki | |
| 2002/0100934 A1 | 8/2002 | Nakagawa | |
| 2002/0121678 A1 | 9/2002 | Huang | |
| 2002/0127783 A1 | 9/2002 | Otsuki | |
| 2002/0137264 A1 | 9/2002 | Kao | |
| 2002/0158246 A1 | 10/2002 | Kitamura | |
| 2003/0052383 A1 | 3/2003 | Nemoto | |
| 2003/0062584 A1 | 4/2003 | Takahashi | |
| 2004/0256691 A1 | 12/2004 | Nemoto | |
| 2005/0151187 A1 | 7/2005 | Wakimoto | |
| 2005/0215042 A1 | 9/2005 | Hille | |
| 2005/0263842 A1 | 12/2005 | Matsui | |
| 2006/0006459 A1 | 1/2006 | Yoshikawa | |
| 2006/0081923 A1 | 4/2006 | Mauder | |
| 2006/0138607 A1 | 6/2006 | Nemoto | |
| 2006/0286753 A1 | 12/2006 | Barthelmess | |
| 2007/0004098 A1 | 1/2007 | Kazama | |
| 2007/0048982 A1 | 3/2007 | Nemoto | |
| 2007/0080407 A1 | 4/2007 | Kono | |
| 2007/0108468 A1 | 5/2007 | Takahashi | |
| 2007/0252195 A1 | 11/2007 | Yoshikawa | |
| 2007/0262304 A1 | 11/2007 | Yu | |
| 2007/0278472 A1 | 12/2007 | Mauder | |
| 2008/0001257 A1* | 1/2008 | Schulze | H01L 29/861 257/E29.2 |
| 2008/0026232 A1 | 1/2008 | Knerer | |
| 2008/0054369 A1 | 3/2008 | Schulze et al. | |
| 2008/0076238 A1 | 3/2008 | Miyashita | |
| 2008/0079119 A1 | 4/2008 | Inoue | |
| 2008/0169526 A1 | 7/2008 | Wakimoto | |
| 2008/0277717 A1 | 11/2008 | Stein Von Kamienski | |
| 2008/0296612 A1 | 12/2008 | Schmidt | |
| 2009/0184340 A1 | 7/2009 | Nemoto | |
| 2009/0194796 A1 | 8/2009 | Hashimoto | |
| 2009/0224284 A1 | 9/2009 | Nemoto | |
| 2009/0236660 A1 | 9/2009 | Takahashi | |
| 2009/0278166 A1 | 11/2009 | Soeno | |
| 2010/0096664 A1 | 4/2010 | Tsukuda | |
| 2010/0155830 A1 | 6/2010 | Takahashi | |
| 2010/0187567 A1 | 7/2010 | Tanabe | |
| 2010/0253312 A1 | 10/2010 | Morimoto | |
| 2010/0327313 A1 | 12/2010 | Nakamura | |
| 2011/0006403 A1 | 1/2011 | Okumura | |
| 2011/0215435 A1 | 9/2011 | Wakimoto | |
| 2011/0281406 A1 | 11/2011 | Ogino | |
| 2011/0316071 A1 | 12/2011 | Hatori | |
| 2012/0068221 A1 | 3/2012 | Kitagawa | |
| 2012/0068310 A1 | 3/2012 | Uemura | |
| 2012/0104456 A1 | 5/2012 | Yu | |
| 2012/0241854 A1 | 9/2012 | Ohta | |
| 2012/0267681 A1 | 10/2012 | Nemoto | |
| 2012/0286288 A1 | 11/2012 | Hussein | |
| 2012/0313139 A1 | 12/2012 | Matsuura | |
| 2012/0319163 A1 | 12/2012 | Tsuzuki | |
| 2013/0009205 A1 | 1/2013 | Tsuzuki | |
| 2013/0075783 A1 | 3/2013 | Yamazaki | |
| 2013/0093065 A1 | 4/2013 | Kachi | |
| 2013/0119432 A1 | 5/2013 | Lu | |
| 2013/0207223 A1 | 8/2013 | Irsigler | |
| 2013/0249058 A1 | 9/2013 | Neidhart | |
| 2013/0260515 A1 | 10/2013 | Mizushima | |

(56) References Cited

U.S. PATENT DOCUMENTS

| | | |
|---|---|---|
| 2013/0264674 A1 | 10/2013 | Mizushima |
| 2014/0061672 A1 | 3/2014 | Wakimoto |
| 2014/0061875 A1 | 3/2014 | Ogura |
| 2014/0070234 A1 | 3/2014 | LoBoda |
| 2014/0070369 A1 | 3/2014 | Kitamura |
| 2014/0084335 A1 | 3/2014 | Senoo |
| 2014/0111270 A1 | 4/2014 | Lu |
| 2014/0159192 A1 | 6/2014 | Kakefu |
| 2014/0162413 A1 | 6/2014 | Wakimoto |
| 2014/0175461 A1 | 6/2014 | Momose |
| 2014/0197477 A1 | 7/2014 | Onishi |
| 2014/0217463 A1 | 8/2014 | Schulze |
| 2014/0246750 A1 | 9/2014 | Takishita |
| 2014/0246755 A1* | 9/2014 | Yoshimura ............ H01L 29/063 257/617 |
| 2014/0246761 A1 | 9/2014 | Veeramma |
| 2014/0291723 A1 | 10/2014 | Miyazaki |
| 2014/0291815 A1 | 10/2014 | Wilshaw |
| 2014/0299915 A1 | 10/2014 | Kouno |
| 2014/0319540 A1 | 10/2014 | Sugimoto |
| 2014/0319576 A1 | 10/2014 | Kobayashi |
| 2014/0357026 A1 | 12/2014 | Kobayashi |
| 2014/0361312 A1 | 12/2014 | Yoshikawa |
| 2014/0374793 A1 | 12/2014 | Miyazaki |
| 2015/0001667 A1 | 1/2015 | Matsuzaki |
| 2015/0050798 A1 | 2/2015 | Kobayashi et al. |
| 2015/0054025 A1 | 2/2015 | Lu |
| 2015/0064852 A1 | 3/2015 | Wakimoto |
| 2015/0069462 A1 | 3/2015 | Mizushima |
| 2015/0087116 A1 | 3/2015 | Bobde |
| 2015/0126000 A1 | 5/2015 | Kakefu |
| 2015/0179441 A1 | 6/2015 | Onozawa |
| 2015/0187930 A1 | 7/2015 | Onishi |
| 2015/0270132 A1 | 9/2015 | Laven |
| 2015/0311279 A1 | 10/2015 | Onozawa |
| 2015/0357229 A1 | 12/2015 | Schulze |
| 2015/0364613 A1 | 12/2015 | Onozawa |
| 2016/0005605 A1 | 1/2016 | Nishio |
| 2016/0035881 A1 | 2/2016 | Tamura |
| 2016/0086799 A1 | 3/2016 | Hiyoshi |
| 2016/0111419 A1 | 4/2016 | Naito |
| 2016/0141364 A1 | 5/2016 | Muramatsu |
| 2016/0141399 A1 | 5/2016 | Jelinek |
| 2016/0149056 A1 | 5/2016 | Nishio |
| 2016/0197143 A1* | 7/2016 | Naito ................. H01L 29/66348 257/334 |
| 2016/0197155 A1 | 7/2016 | Hiyoshi |
| 2016/0247894 A1 | 8/2016 | Hamada |
| 2016/0276446 A1 | 9/2016 | Wakimoto |
| 2016/0276497 A1 | 9/2016 | Mizukami |
| 2016/0307993 A1 | 10/2016 | Kuribayashi |
| 2016/0336390 A1 | 11/2016 | Hamada |
| 2017/0047319 A1 | 2/2017 | Naito |
| 2017/0077217 A1 | 3/2017 | Ogawa |
| 2017/0117384 A1 | 4/2017 | Lee |
| 2017/0133227 A1 | 5/2017 | Kajiwara |
| 2017/0141206 A1 | 5/2017 | Koga |
| 2017/0213735 A1 | 7/2017 | Imaoka |
| 2017/0229465 A1 | 8/2017 | Luan |
| 2017/0236908 A1 | 8/2017 | Naito |
| 2017/0316934 A1 | 11/2017 | Napetschnig |
| 2017/0338335 A1 | 11/2017 | Takaoka |
| 2017/0352730 A1 | 12/2017 | Nakamura |
| 2017/0373141 A1 | 12/2017 | Yoshida |
| 2018/0012762 A1 | 1/2018 | Mukai |
| 2018/0047725 A1 | 2/2018 | Yoshida |
| 2018/0061935 A1 | 3/2018 | Wakimoto |
| 2018/0076290 A1 | 3/2018 | Takayanagi |
| 2018/0108737 A1 | 4/2018 | Naito |
| 2018/0138299 A1 | 5/2018 | Naito |
| 2018/0182754 A1 | 6/2018 | Naito |
| 2018/0182844 A1 | 6/2018 | Nakamura |
| 2018/0233564 A1 | 8/2018 | Kumada |
| 2018/0248003 A1 | 8/2018 | Nakamura |
| 2018/0269063 A1 | 9/2018 | Kodama |
| 2018/0323263 A1 | 11/2018 | Tawara |
| 2018/0350960 A1 | 12/2018 | Naito |
| 2018/0350962 A1 | 12/2018 | Naito |
| 2018/0358444 A1 | 12/2018 | Ryo |
| 2018/0374918 A1 | 12/2018 | Nishio |
| 2019/0019879 A1 | 1/2019 | Lee |
| 2019/0067174 A1 | 2/2019 | Seok |
| 2019/0067462 A1 | 2/2019 | Tamura |
| 2019/0067493 A1 | 2/2019 | Seok |
| 2019/0096989 A1 | 3/2019 | Yoshida |
| 2019/0097030 A1 | 3/2019 | Miyata |
| 2019/0131443 A1 | 5/2019 | Hoshi |
| 2019/0139772 A1 | 5/2019 | Kodama |
| 2019/0157264 A1 | 5/2019 | Yoshida |
| 2019/0165102 A1 | 5/2019 | Fujimoto |
| 2019/0206860 A1 | 7/2019 | Kamimura |
| 2019/0252374 A1 | 8/2019 | Kanetake |
| 2019/0252503 A1 | 8/2019 | Uehigashi |
| 2019/0252533 A1 | 8/2019 | Naito |
| 2019/0252534 A1 | 8/2019 | Murakawa |
| 2019/0259748 A1 | 8/2019 | Naito |
| 2019/0267370 A1 | 8/2019 | Sato |
| 2019/0287961 A1 | 9/2019 | Naito |
| 2019/0287962 A1 | 9/2019 | Naito |
| 2019/0288060 A1 | 9/2019 | Naito |
| 2019/0326118 A1 | 10/2019 | Naito |
| 2019/0348289 A1 | 11/2019 | Kodama |
| 2019/0393312 A1 | 12/2019 | Tawara |
| 2020/0035817 A1 | 1/2020 | Tamura |
| 2020/0058506 A1 | 2/2020 | Nakamura |
| 2020/0058735 A1 | 2/2020 | Naito |
| 2020/0058803 A1 | 2/2020 | Naito |
| 2020/0091329 A1 | 3/2020 | Mitsuzuka |
| 2020/0098747 A1 | 3/2020 | Tamura |
| 2020/0105745 A1 | 4/2020 | Obata |
| 2020/0135593 A1 | 4/2020 | Takishita |
| 2020/0144149 A1 | 5/2020 | Kubouchi |
| 2020/0144371 A1 | 5/2020 | Tawara |
| 2020/0161457 A1 | 5/2020 | Takahashi |
| 2020/0161460 A1 | 5/2020 | Harada |
| 2020/0194429 A1 | 6/2020 | Naito |
| 2020/0194562 A1 | 6/2020 | Yoshimura |
| 2020/0258978 A1 | 8/2020 | Nishio |
| 2020/0258998 A1 | 8/2020 | Kodama |

FOREIGN PATENT DOCUMENTS

| | | |
|---|---|---|
| JP | H8-102545 A | 4/1996 |
| JP | H9-232332 A | 9/1997 |
| JP | H10116998 A | 5/1998 |
| JP | 2000-22174 A | 1/2000 |
| JP | 2000-223720 A | 8/2000 |
| JP | 2001-156299 A | 6/2001 |
| JP | 2001-160559 A | 6/2001 |
| JP | 2008-211148 A | 9/2008 |
| JP | 2010141170 A | 6/2010 |
| JP | 2012-199577 A | 10/2012 |
| WO | 2013/141141 A1 | 9/2013 |
| WO | 2013141221 A1 | 9/2013 |

OTHER PUBLICATIONS

Office Action issued for counterpart Japanese Application 2016-551621, issued by the Japan Patent Office dated Dec. 26, 2017.

Office Action issued for counterpart Chinese Application 201580002976.5, issued by the Chinese Intellectual Property Office dated May 10, 2018.

Office Action issued for counterpart Japanese Application No. 2018-026650, drafted by the Japan Patent Office dated Nov. 29, 2018.

U.S. Appl. No. 15/169,740, filed Jun. 1, 2016, to Hiroki Wakimoto et al.

U.S. Appl. No. 16/430,444, filed Jun. 4, 2019, to Hiroki Wakimoto et al.

* cited by examiner

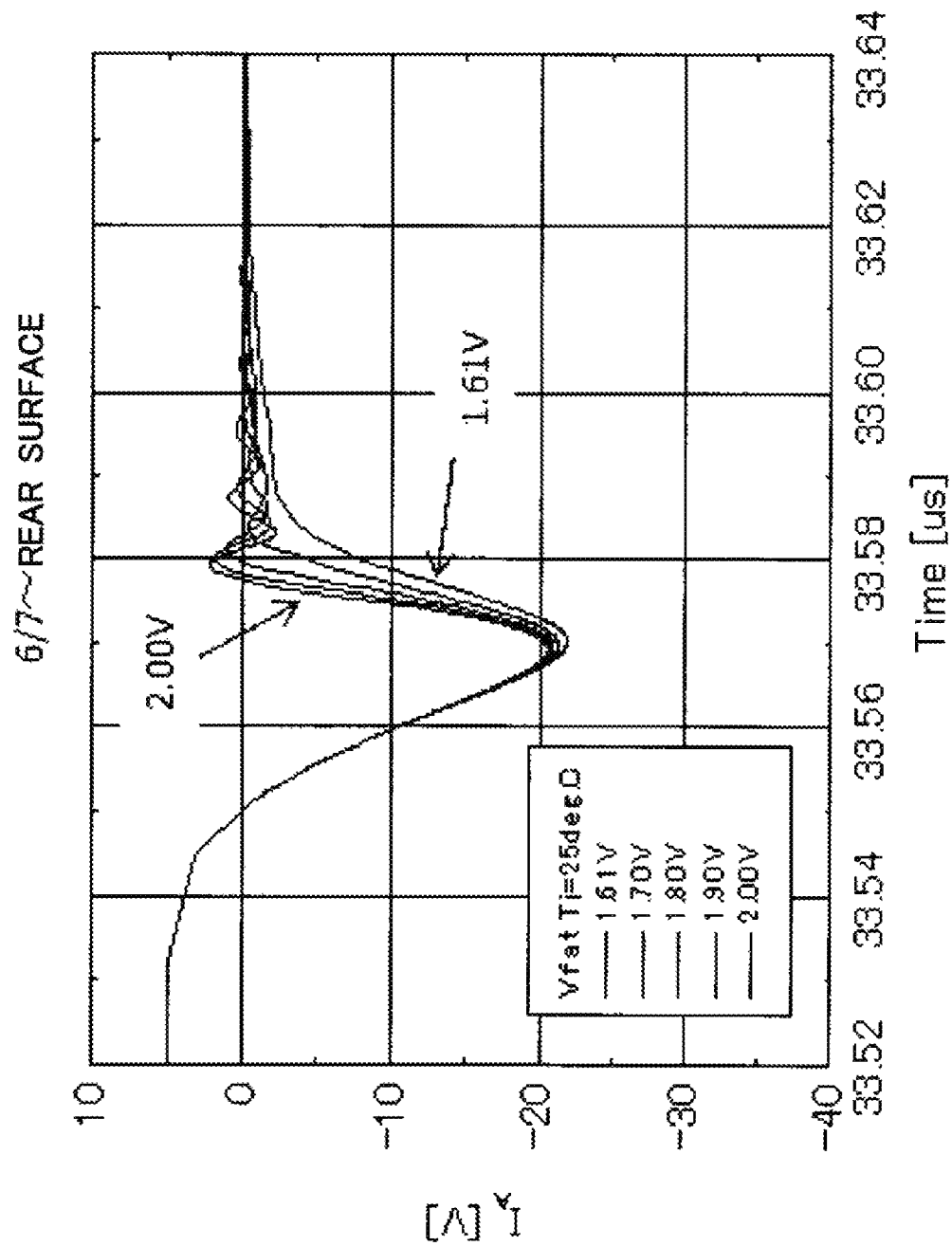

SEMICONDUCTOR DEVICE, AND METHOD OF MANUFACTURING SEMICONDUCTOR DEVICE

This application is a continuation of U.S. patent application Ser. No. 16/430,444, filed Jun. 4, 2019; which is a divisional of U.S. patent application Ser. No. 15/169,740, filed on Jun. 1, 2016; which is a continuation of International Patent Application No. PCT/JP2015/072933, filed Aug. 13, 2015; which claims priority to Japanese Patent Application No. 2014-204849, filed Oct. 3, 2014, the entirety of the contents of each of which are hereby incorporated herein by reference.

BACKGROUND

1. Technical Field

The present invention relates to a semiconductor device and a method of manufacturing a semiconductor device.

2. Related Art

Conventionally, a vertical semiconductor device in which an anode and a cathode are provided to the front surface and rear surface of a semiconductor substrate has been known. The semiconductor device is used for example as a FWD (free wheeling diode) (see Patent Document 1, for example). Related prior art documents include the following documents.

Patent Document 1: Japanese Patent Application Publication No. 2012-199577
Patent Document 2: WO 2013/100155
Patent Document 3: U.S. Pat. No. 6,482,681
Patent Document 4: U.S. Pat. No. 6,707,111
Patent Document 5: Japanese Patent Application Publication No. 2001-160559
Patent Document 6: Japanese Patent Application Publication No. 2001-156299
Patent Document 7: Japanese Patent Application Publication No. H7-193218
Patent Document 8: United States Patent Application Publication No. 2008-1257
Patent Document 9: United States Patent Application Publication No. 2008-54369

Preferred characteristics of the above-mentioned semiconductor device include a low reverse recovery loss (that is, a low peak current Irp of a reverse recovery current and a low tail current of a reverse recovery current) and gentle reverse recovery (that is, a gentle rate of temporal change dV/dt of reverse recovery voltage).

SUMMARY

[General Disclosure of the Invention]
In accordance with one aspect of the invention a semiconductor device comprises an n-type semiconductor substrate. A p-type semiconductor region is formed in a front surface side of the semiconductor substrate. An n-type field stop region is formed in a rear surface side of the semiconductor substrate. The n-type field stop region includes protons as a donor. A concentration distribution of the donor in the field stop region in a depth direction has a plurality of peaks including a first peak, a second peak that is closer to the rear surface of the semiconductor substrate than the first peak is, a third peak that is closer to the rear surface of the semiconductor substrate than the second peak is, and a fourth peak that is closer to the rear surface of the semiconductor substrate than the third peak is. Each of the plurality of peaks including the first peak, the second peak, the third peak and the fourth peak has a peak maximum point, and peak end points formed at both sides of the peak maximum point. The peak maximum point of the first peak and the peak maximum point of the second peak are higher than the peak maximum point of the third peak. The peak maximum point of the third peak is lower than the peak maximum point of the fourth peak.

In accordance with another aspect of the invention a method for manufacturing a semiconductor device comprises providing an n-type semiconductor substrate. A p-type semiconductor region is formed in a front surface side of the semiconductor substrate. An n-type field stop region is formed in a rear surface side of the semiconductor substrate, the n-type field stop region including protons as a donor. A concentration distribution of the donor in the field stop region in a depth direction has a plurality of peaks including a first peak, a second peak that is closer to the rear surface of the semiconductor substrate than the first peak is, a third peak that is closer to the rear surface of the semiconductor substrate than the second peak is, and a fourth peak that is closer to the rear surface of the semiconductor substrate than the third peak is. Each of the plurality of peaks including the first peak, the second peak, the third peak, and the fourth peak has a peak maximum point, and peak end points formed at both sides of the peak maximum point. The peak maximum point of the first peak and the peak maximum point of the second peak are higher than the peak maximum point of the third peak. The peak maximum point of the third peak is lower than the peak maximum point of the fourth peak.

The summary clause does not necessarily describe all necessary features of the embodiments of the present invention. The present invention may also be a sub-combination of the features described above.

BRIEF DESCRIPTION OF THE DRAWINGS

FIG. 20B shows the relationship between the carrier lifetime (forward voltage) of a depth region from 6/7 to the rear surface of the semiconductor substrate 10, and a temporal waveform of anode current $I_A$.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
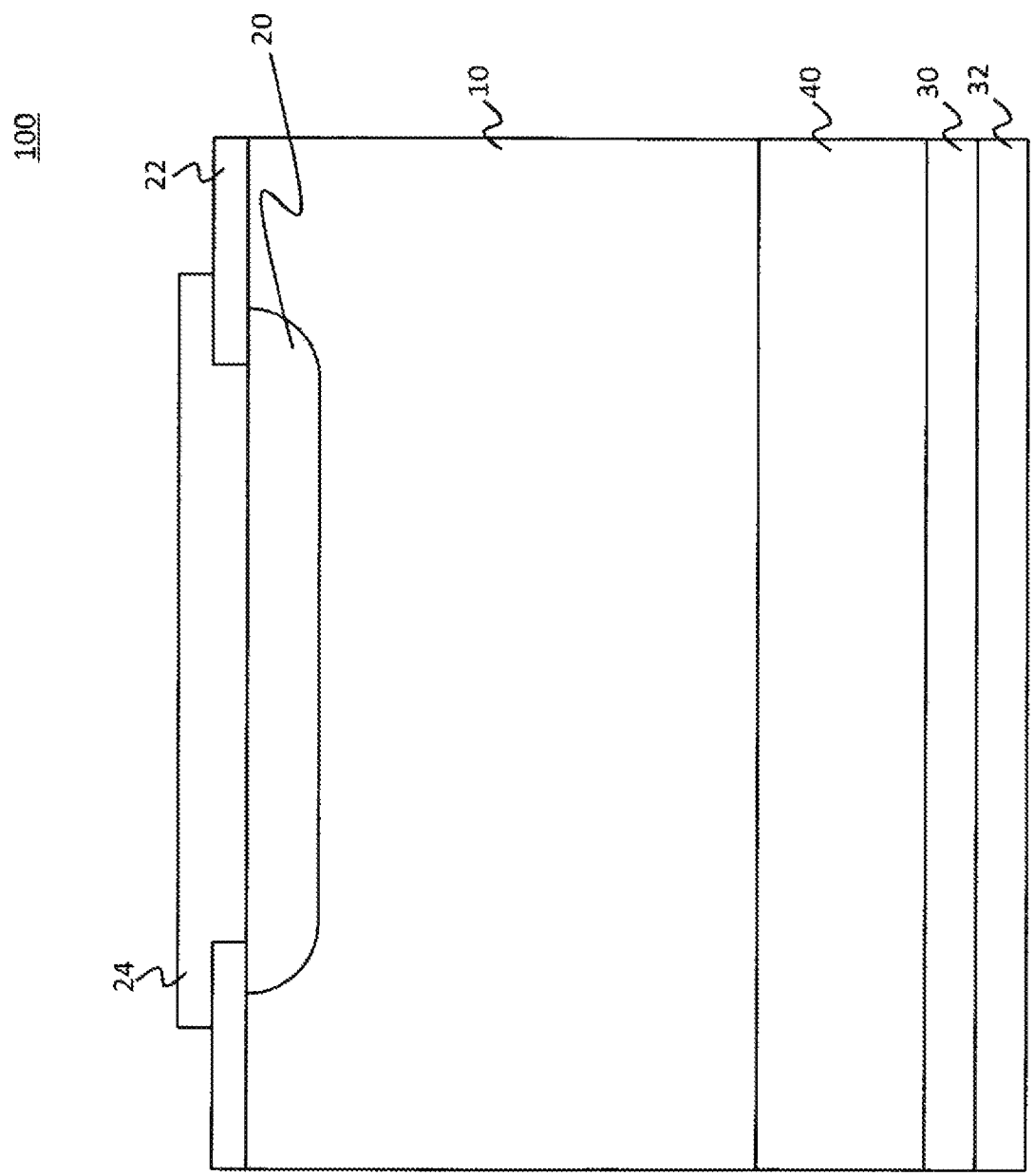
FIG. 1 shows a figure illustrating the gist of a semiconductor device 100 according to an embodiment of the present invention.

FIG. 1 shows a figure illustrating the gist of a semiconductor device 100 according to an embodiment of the present invention. FIG. 1 shows a schematic view of a section of the semiconductor device 100. The semiconductor device 100 in the present example is used as a free wheeling diode (FWD) provided to be parallel with a high withstand voltage switch such as an IGBT, for example. The semiconductor device 100 of the present example comprises an $n^-$-type semiconductor substrate 10, an insulation film 22, an anode electrode 24 and a cathode electrode 32. Also, a $p^+$-type anode region 20 is formed in the semiconductor substrate 10 on its front surface side, and a field stop region (FS region 40) and an $n^+$-type cathode region 30 are formed in the semiconductor substrate 10 on its rear surface side.

The semiconductor substrate 10 is a silicon substrate, for example. The insulation film 22 is formed to cover the front surface of the semiconductor substrate 10. However, the insulation film 22 has an opening through which the anode region 20 is exposed. The insulation film 22 is formed with an insulating material such as silicon oxide or silicon nitride, for example.

The anode electrode 24 is formed on the anode region 20 exposed through the opening of the insulation film 22. The anode electrode 24 is formed with metal such as aluminum, for example.

The FS region 40 is an n-type region formed with protons (hydrogen ions) as the donor. The impurity concentration of the FS region (the donor concentration in the present example) is higher than the impurity concentration of the semiconductor substrate 10. The cathode region 30 is formed in the semiconductor substrate 10 to be closer to its rear surface than the FS region 40 is. The cathode region 30 is an $n^+$-type region formed with phosphorus or the like as the donor, for example. The impurity concentration of the cathode region 30 is higher than both the impurity concentration of the semiconductor substrate 10 and the impurity concentration of the FS region 40. The cathode electrode 32 is formed on the rear surface of the semiconductor substrate 10, and is connected with the cathode region 30. With such a configuration, the semiconductor device 100 functions as a diode.

Figure 2:
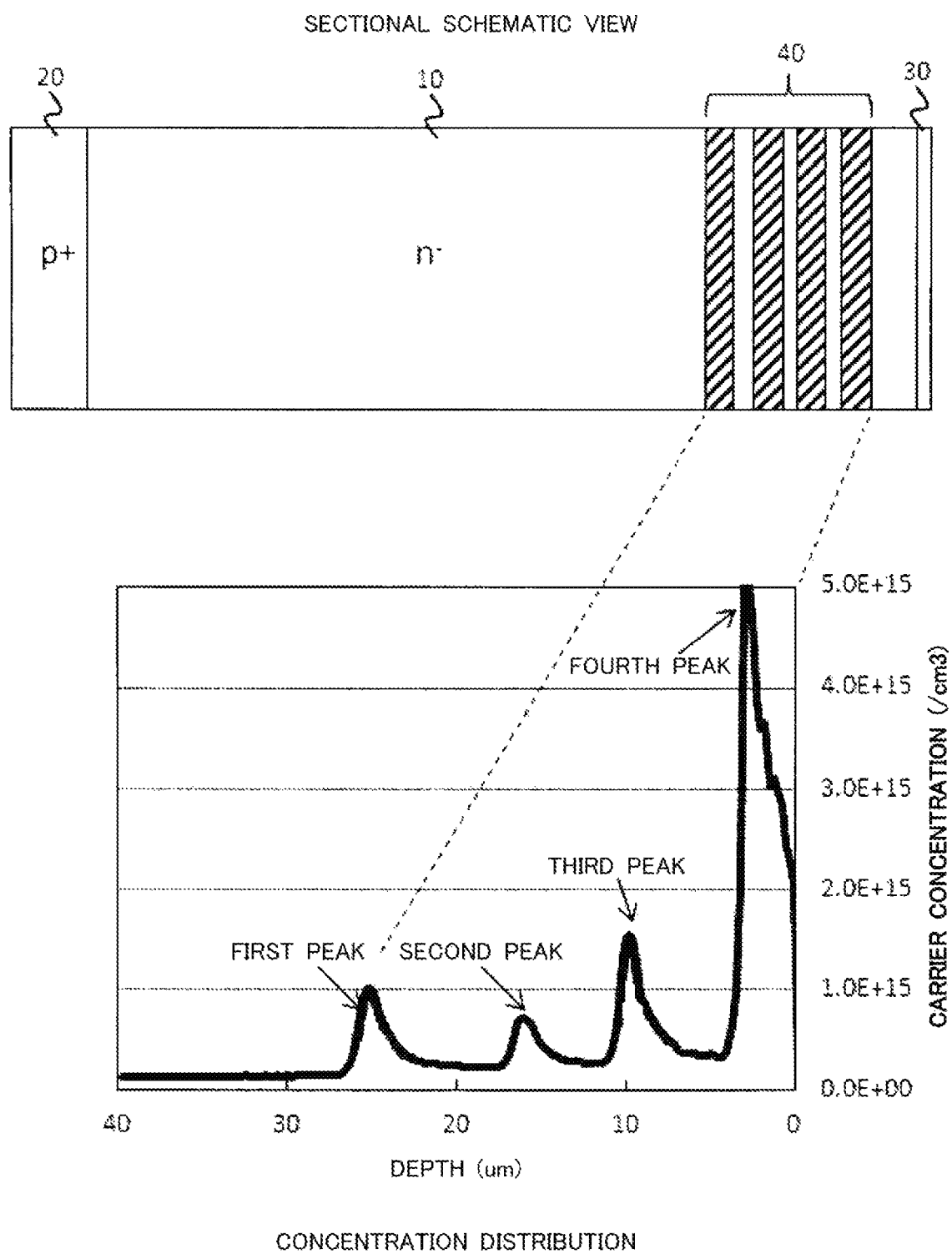
FIG. 2 shows a sectional schematic view of the semiconductor device 100 and a figure illustrating the carrier concentration distribution in an FS region 40.

FIG. 2 shows a sectional schematic view of the semiconductor device 100 and a figure illustrating the carrier concentration distribution in the FS region 40. In the sectional schematic view of the semiconductor device 100 shown in FIG. 2, the insulation film 22, the anode electrode 24 and the cathode electrode 32 are omitted. Also, in the concentration distribution shown in FIG. 2, the horizontal axis indicates the depth position within the FS region 40 from its rear surface side end portion, and the vertical axis indicates the carrier concentration. The carrier concentration corresponds to the donor concentration of protons injected into the FS region 40.

As shown in FIG. 2, the concentration distribution of the donor in the FS region 40 in its depth direction has a plurality of peaks. The peaks refer to maximum values, for example. A first peak, a second peak, a third peak and a fourth peak are present in the concentration distribution of the donor in the FS region 40 of the present example. The first peak is present at the deepest position in the FS region 40 as seen from the rear surface side (cathode side) of the semiconductor substrate 10. In the present specification, locations whose distances from the rear surface side (cathode side) of the semiconductor substrate 10 are longer are referred to as "deeper positions", and locations whose distances are shorter are referred to as "shallower positions."

The second peak is present at a position shallower than that of the first peak. Also, the donor concentration of the second peak is lower than the donor concentration of the first peak. The third peak is present at a position shallower than that of the second peak. In the present example, the donor concentration of the third peak is higher than both the donor concentration of the second peak and the donor concentration of the first peak. The donor concentration of the third peak may be lower than at least either one of the donor concentration of the second peak and the donor concentration of the first peak.

The fourth peak is present at a position shallower than that of the third peak. In the present example, the fourth peak is present at the shallowest position in the FS region 40. The fourth peak may be provided at a position adjacent to or apart from the cathode region 30. The plurality of peaks may be provided at regular intervals or irregular intervals in the FS region 40 in its depth direction. In the present example, the donor concentration of the fourth peak is higher than the donor concentrations of all the other peaks.

That is, in the present example, while the concentration of a peak decreases as the distance, in the FS region 40, from the rear surface side of the semiconductor substrate 10 increases, the concentration of the first peak at the deepest position becomes higher than the concentration of the second peak at the second deepest position. In this manner, by making the concentration of the first peak higher than the concentration of the second peak, the distribution of the carrier lifetime of the semiconductor substrate 10 in its depth direction can be controlled appropriately.

For example, in the semiconductor substrate 10, the carrier lifetime is controlled by irradiation with an electron ray or the like. Irradiation with an electron ray or the like dissociates the bonds between atoms of silicon crystal or the like forming the semiconductor substrate 10, and crystal defects occur. Thereby, the carrier lifetime becomes short. Irradiation with an electron ray or the like makes the carrier lifetime short almost uniformly over the entire semiconductor substrate 10.

On the other hand, protons terminate atoms whose bonds have been dissociated to repair the above-mentioned crystal defects. That is, protons have a function of recovering a carrier lifetime. For this reason, the distribution of a carrier lifetime can be controlled by controlling the concentration distribution of protons to be injected into the semiconductor substrate 10.

Figure 3:
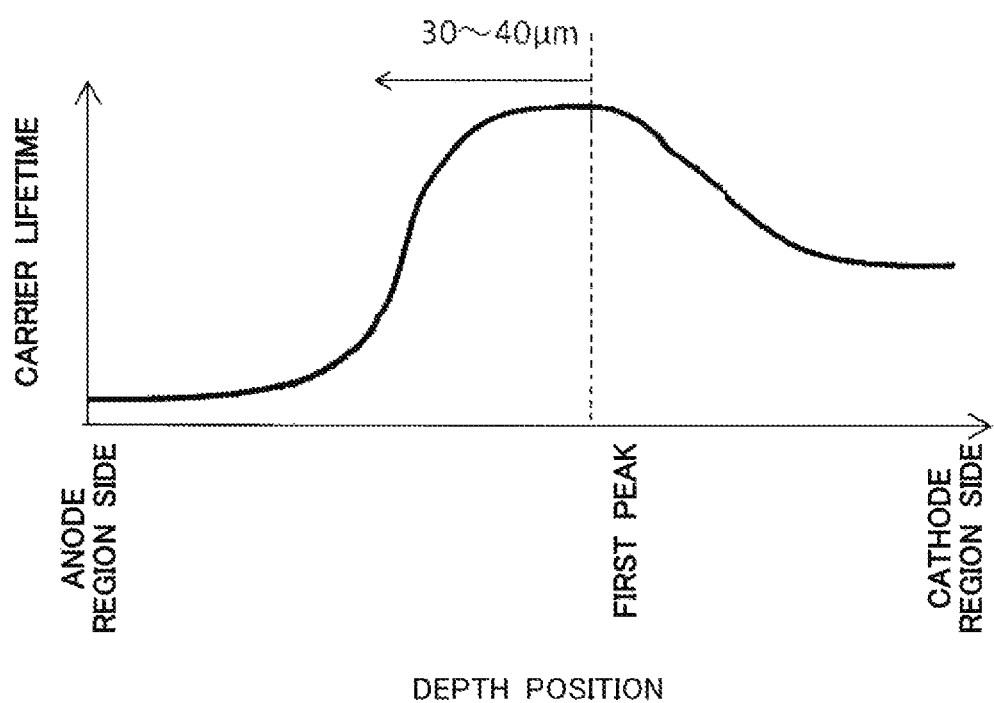
FIG. 3 shows a schematic view illustrating a distribution example of the carrier lifetime of a semiconductor substrate 10 in its depth direction.

FIG. 3 shows a schematic view illustrating a distribution example of the carrier lifetime of the semiconductor substrate 10 in its depth direction. In FIG. 3, the horizontal axis indicates positions in the depth direction of the semiconductor substrate 10, and the vertical axis indicates the carrier lifetimes. However, the distribution example shows in FIG. 3 is schematic, and the thickness of the semiconductor substrate 10 and the thickness of the FS region 40 do not match those in the example of FIG. 2. For example, in FIG. 3, the first peak of the FS region is positioned near the center of the anode region 20 and the cathode region 30.

When protons are injected and then diffused by annealing or the like so as to attain the concentration distribution shown in FIG. 2, the diffused protons hydrogen-terminate crystal defects to recover a carrier lifetime. Because in the present example, the concentration of protons injected to the deepest position of the FS region 40 is high, the carrier lifetime of an intermediate portion of the semiconductor substrate 10 becomes longer than those on the front surface and rear surface of the semiconductor substrate 10 as shown in FIG. 3.

That is, the carrier lifetime in at least a partial region between the anode region 20 and the cathode region 30 is longer than the carrier lifetimes in both the anode region 20 and the cathode region 30. The concentration distribution of protons injected is controlled to attain such a distribution of carrier lifetimes. In the present example, the carrier lifetime at a depth position that exhibits the first peak shown in FIG. 2 becomes longer than the carrier lifetimes in both the anode region 20 and the cathode region 30.

By attaining such a distribution of carrier lifetimes, the peak current Irp and the tail current of a reverse recovery current can be made small to decrease a reverse recovery loss, and the rate of temporal change dV/dt of reverse recovery voltage can be made small to realize gentle reverse recovery.

Because protons are diffused toward the front surface side of the semiconductor substrate 10, the region that has a carrier lifetime longer than that in the anode region 20 extends toward the front surface side of the semiconductor substrate 10 past a position that is at the deepest portion in the FS region 40 and exhibits the first peak, as shown in FIG. 3. The extension amount of the region is estimated to be approximately 30 to 40 μm from the position of the first peak as described below with reference to FIG. 4. The depth position of the first peak is preferably determined considering the extension amount.

Figure 4:
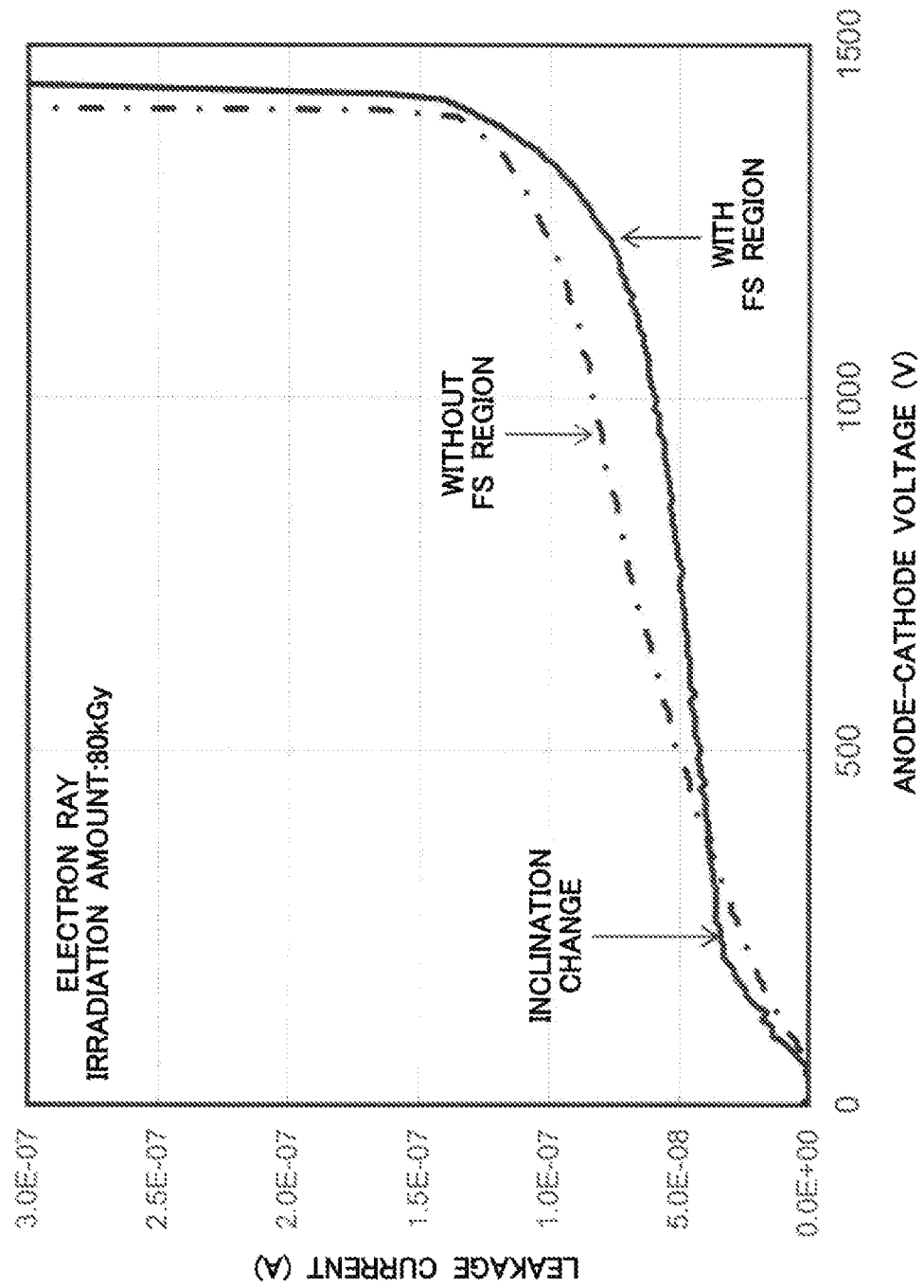
FIG. 4 shows a figure illustrating one exemplary leakage current waveform of the semiconductor device 100.

FIG. 4 shows a figure illustrating one exemplary leakage current waveform of the semiconductor device 100. In FIG. 4, the horizontal axis indicates the reverse voltage between the anode and the cathode, and the vertical axis indicates the leakage current. Also, as a comparative example, a leakage current waveform of a semiconductor device in which the FS region 40 is not formed is shown with a broken line. The semiconductor device 100 of the present example in which the FS region 40 is formed exhibits generally decreased leakage current as compared with the semiconductor device in which the FS region 40 is not formed.

The semiconductor device 100 of the present example exhibits a steep inclination of leakage current increase relative to reverse voltages of up to approximately 200 to 300 V. With a further larger reverse voltage, the inclination of current decreases. The decrease in the inclination of current is deemed to be attributable to the fact that the depletion layer expanded by increase in voltage entered a region where the carrier lifetime was recovered by protons.

The relationship between reverse voltage V and depletion layer width W is expressed as follows.

$$W = \sqrt{\frac{2\epsilon N_A}{qN_D(N_A + N_D)}(V_{bi} - V)}$$

Here, Vbi is a built-in voltage, $N_A$ is an accepter concentration, $N_D$ is a donor concentration, $\epsilon$ is the dielectric constant of the semiconductor substrate 10, and q is an electric charge. Calculation of the depletion layer width W corresponding to a voltage at a changing point at which the inclination of current changes with the expression shown above gives approximately 50 to 60 The first peak is positioned approximately 30 μm from the rear surface of the semiconductor substrate 10. Also, the thickness of the semiconductor substrate 10 is approximately 110 Accordingly, as explained with reference to FIG. 3, protons are estimated to be diffused by approximately 30 μm from the position of the first peak toward the front surface side of the semiconductor substrate 10.

Figure 5:
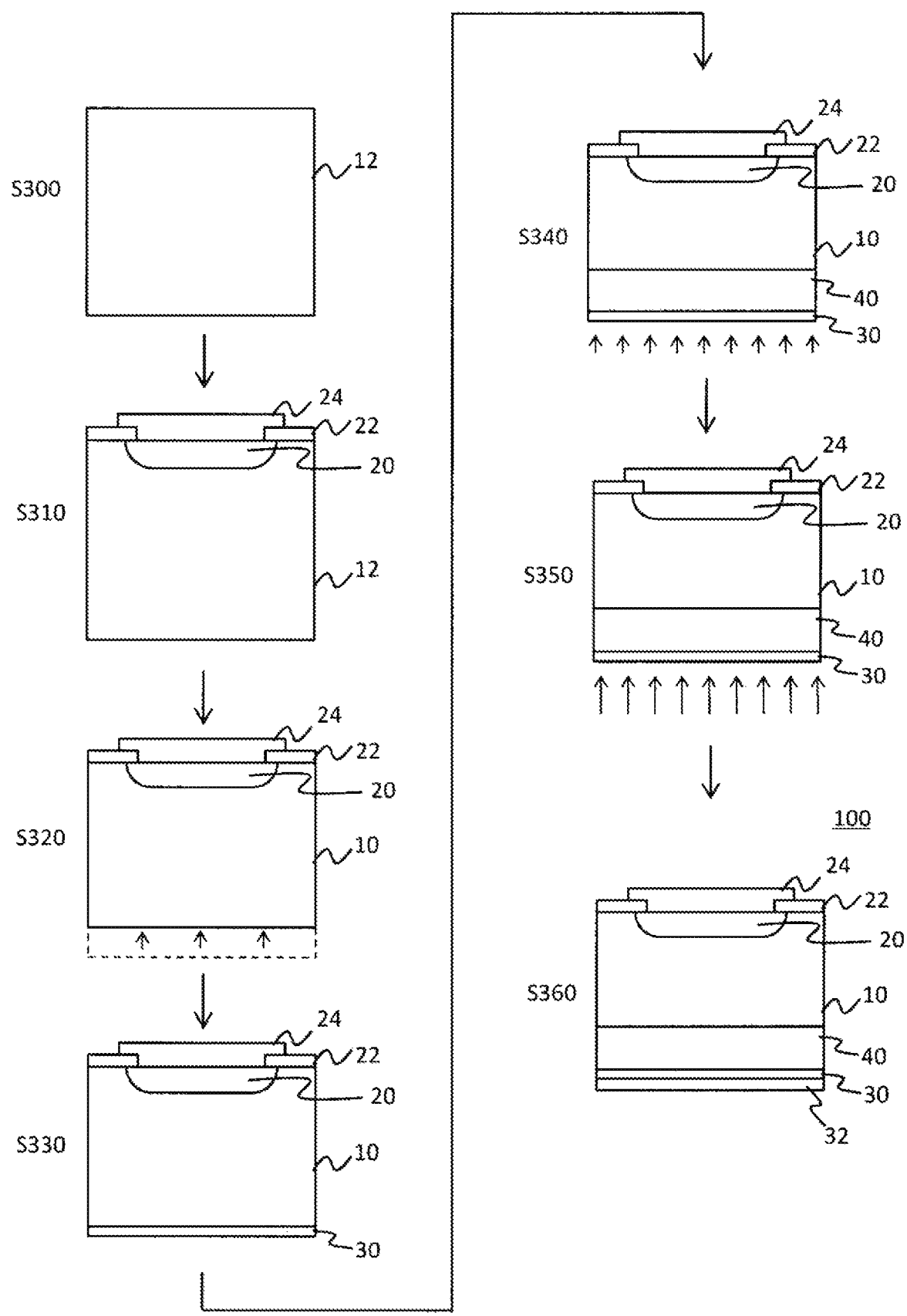
FIG. 5 shows a figure illustrating one exemplary manufacturing direction of the semiconductor device 100.

FIG. 5 shows a figure illustrating one exemplary manufacturing direction of the semiconductor device 100. First, at a substrate preparation step S300, a semiconductor substrate 12 is prepared. The semiconductor substrate 12 functions as the semiconductor substrate 10 by being ground at its rear surface at a grinding step S320 described below. That is, the semiconductor substrate 12 is formed with a material which is the same as that of the semiconductor substrate 10, and is thicker than the semiconductor substrate 10. The substrate resistivities of the semiconductor substrate 12 and the semiconductor substrate 10 may be approximately 70 to 90 Ωcm.

Next, at a front surface side forming step S310, the element structure of the front surface side of the semiconductor substrate 12 is formed. In the present example, the anode region 20, the insulation film 22 and the anode electrode 24 are formed on the front surface of the semiconductor substrate 12. Also, after forming the element structure, a protection film to protect the element structure may be formed. The protection film may be removed after manufacturing the semiconductor device 100. Because the structure of the front surface side is formed by using the thick semiconductor substrate 12, the possibility of a crack or the like of the semiconductor substrate 12 occurring at the front surface side forming step S310 can be lowered.

Next, at the grinding step S320, the rear surface side of the semiconductor substrate 12 is ground to form the semiconductor substrate 10. The thickness of the semiconductor substrate 10 after grinding is determined based on a rated voltage or the like of the semiconductor device 100. The thickness of the semiconductor substrate 10 in the present example is approximately 100 to 130

Next, at a cathode region formation step S330, the cathode region 30 is formed on the rear surface of the semiconductor substrate 10. At S330, n-type impurities such as phosphorus are ion-injected from the rear surface side of the semiconductor substrate 10. After ion-injecting the impurities, laser annealing, for example, is performed on a region where the cathode region 30 should be formed to activate impurity ions and turn them into a donor. Thereby, the cathode region 30 is formed.

Next, at an FS region formation step S340, protons are injected into a region where the FS region 40 should be formed. At S340, as shown in FIG. 2, protons are injected into the FS region 40 so that the concentration distribution of protons in the FS region 40 in its depth direction has a plurality of peaks. Among the plurality of peaks, the first peak closest to the front surface of the semiconductor substrate 10 may be higher than the second peak closer to the rear surface of the semiconductor substrate 10 than the first peak is. Thereby, the FS region 40 is formed. The condition ranges of the acceleration voltage and injection amount of protons in the present example are as follows. Each value shown in the parentheses is a value to be one example. Thereby, the concentration distribution similar to that in the example of FIG. 2 is formed.

First peak: 1 to 4 MeV (1.5 MeV), 3E12 to 3E13 $cm^{-2}$ (1E13 $cm^{-2}$)

Second peak: 0.8 to 3 MeV (1 Mev), 1E12 to 1E13 $cm^{-2}$ (7E12 $cm^{-2}$)

Third peak: 0.6 to 2 MeV (0.8 MeV), 3E12 to 3E13 $cm^{-2}$ (1E13 $cm^{-2}$)

Fourth peak: 0.2 to 1 MeV (0.4 MeV), 3E13 to 1E15 $cm^{-2}$ (3E14 $cm^{-2}$)

Also, the preferred ranges of respective peak concentrations of the FS region 40 and depths from the rear surface in the present example are as follows. Each value shown in the parentheses is a value to be one example. Also, because the second peak, the third peak and the fourth peak are formed in passage regions of protons for deeper peaks, the donor concentrations are raised due to the influence of protons in the passage regions having been turned into the donor. For this reason, for example, even if the injection amount of protons at the first peak, and the injection amount of protons at the third peak are the same, the donor concentration of the third peak is higher than that of the first peak. Because the donor concentrations of the passage regions of protons of the first and second peak are added thereto.

First peak: 2E14 to 2E15 $cm^{-3}$ (9E14 $cm^{-3}$), 15 to 150 μm (30 μm)

Second peak: 1E14 to 1E15 $cm^{-3}$ (5E14 $cm^{-3}$), 10 to 100 μm (15 μm)

Third peak: 3E14 to 3E15 $cm^{-3}$ (2E15 $cm^{-3}$), 5 to 50 μm (10 μm)

Fourth peak: 3E14 to 3E16 $cm^{-3}$ (5E15 $cm^{-3}$), 1.5 to 15 μm (3 μm)

The position of the first peak may be determined according to the withstand voltage class of the semiconductor device 100. As described above, protons are diffused by a certain distance toward the front surface side of the semiconductor substrate 10. Because the size of a region on the front surface side of the semiconductor substrate 10 desired to be left as a region where protons are not diffused is determined according to the withstand voltage class of the semiconductor device 100, the position of the first peak may be determined considering the distance by which protons are diffused. The position of the first peak in a 1700-V withstand voltage semiconductor device 100, for example, is deeper than the position of the first peak in a 1200-V withstand voltage semiconductor device 100. Also, in a 600-V withstand voltage semiconductor device 100, the first peak is provided at a position shallower than that in the 1200-V withstand voltage semiconductor device 100.

Next, at a lifetime control step S350, the rear surface side of the semiconductor substrate 10 is irradiated with a lifetime killer. At S350, the rear surface side of the semiconductor substrate 10 is irradiated for example with an electron ray. Although the lifetime killer is not limited to an electron ray, one that enables recovery, by protons, of a carrier lifetime shortened by the lifetime killer is used. At S350, after irradiation with the lifetime killer, the semiconductor substrate 10 is annealed. Thereby, protons are diffused within the semiconductor substrate 10, and the carrier lifetime of a partial region recovers, and the carrier lifetime distribution as shown in FIG. 3 is attained.

Next, at a cathode electrode formation step S360, the cathode electrode 32 is formed in the semiconductor substrate 10 on its rear surface side. After forming the cathode electrode 32, a thermal process of the cathode electrode 32 may be performed. Thereby, the semiconductor device 100 can be manufactured.

Figure 6:
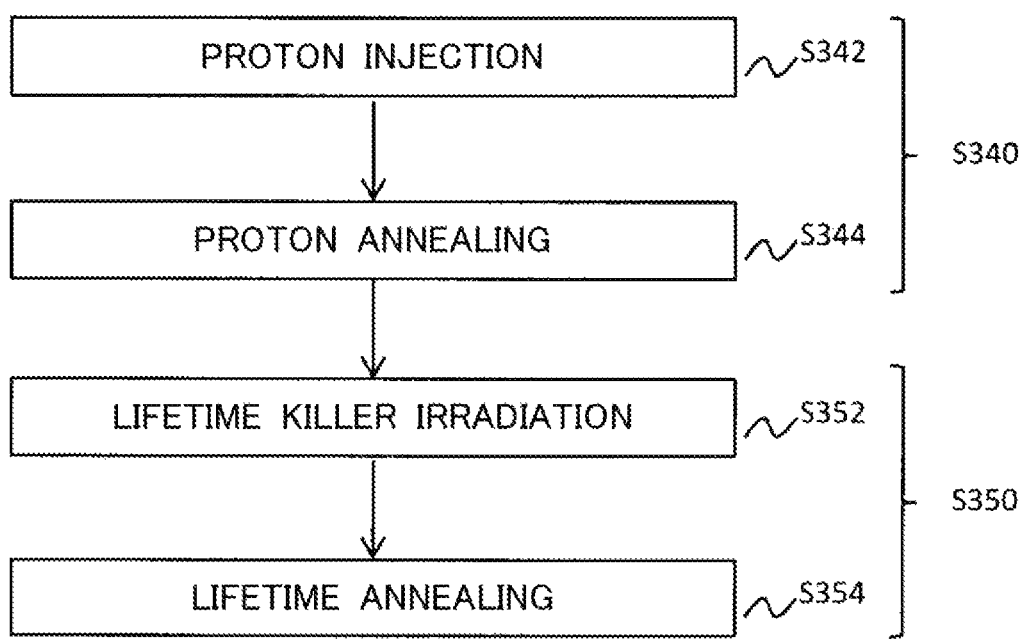
FIG. 6 shows a figure illustrating one example of an FS region formation step S340 and a lifetime control step S350.

FIG. 6 shows a figure illustrating one example of the FS region formation step S340 and the lifetime control step S350. The FS region formation step S340 of the present example has a proton injection step S342 and a proton annealing step S344. Also, the lifetime control step S350 has a lifetime killer irradiation step S352 and a lifetime annealing step S354.

At the proton injection step S342, protons are injected into a region where the FS region 40 should be formed as described above. Then, at the proton annealing step S344, the semiconductor substrate 10 is annealed. By annealing the semiconductor substrate 10, protons present excessively in the semiconductor substrate 10 can be expelled. At the proton annealing step S344, the annealing temperature is approximately 300 to 500° C., for example, and the annealing duration is approximately 0.5 to 10 hours, for example.

Then, after the proton annealing step S344, irradiation with a lifetime killer is performed (S352), and lifetime annealing is performed (S354). At the lifetime annealing step S354, the annealing temperature is approximately 300 to 500° C., for example, and the annealing duration is approximately 0.5 to 10 hours, for example. In the present example, irradiation with an electron ray of 80 kGy is performed. Because the present example comprises the proton annealing step S344 of annealing the semiconductor substrate 10 between the proton injection step S342 and the lifetime killer irradiation step S352, and excess protons are expelled from the semiconductor substrate 10 at the proton annealing step S344, an appropriate amount of the protons is diffused by lifetime annealing. Thereby, the carrier lifetime in a region where protons are diffused recovers. For this reason, both decrease in the carrier lifetimes on the anode region 20 side and cathode region 30 side by lifetime killer irradiation, and recovery of the carrier lifetime in a region between the anode region 20 and the cathode region 30 by proton diffusion can be realized.

Figure 7:
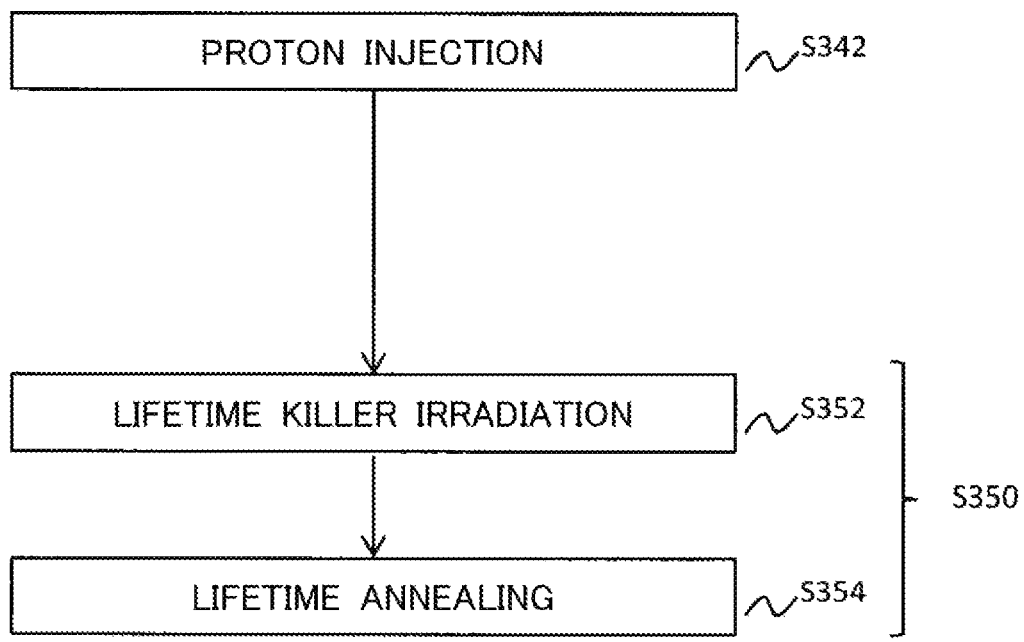
FIG. 7 shows a figure illustrating another example of the FS region formation step S340 and the lifetime control step S350.

FIG. 7 shows a figure illustrating another example of the FS region formation step S340 and the lifetime control step S350. In the present example, the FS region formation step S340 does not have the proton annealing step S344. Other respects are the same as the example shown in FIG. 6.

Figure 8:
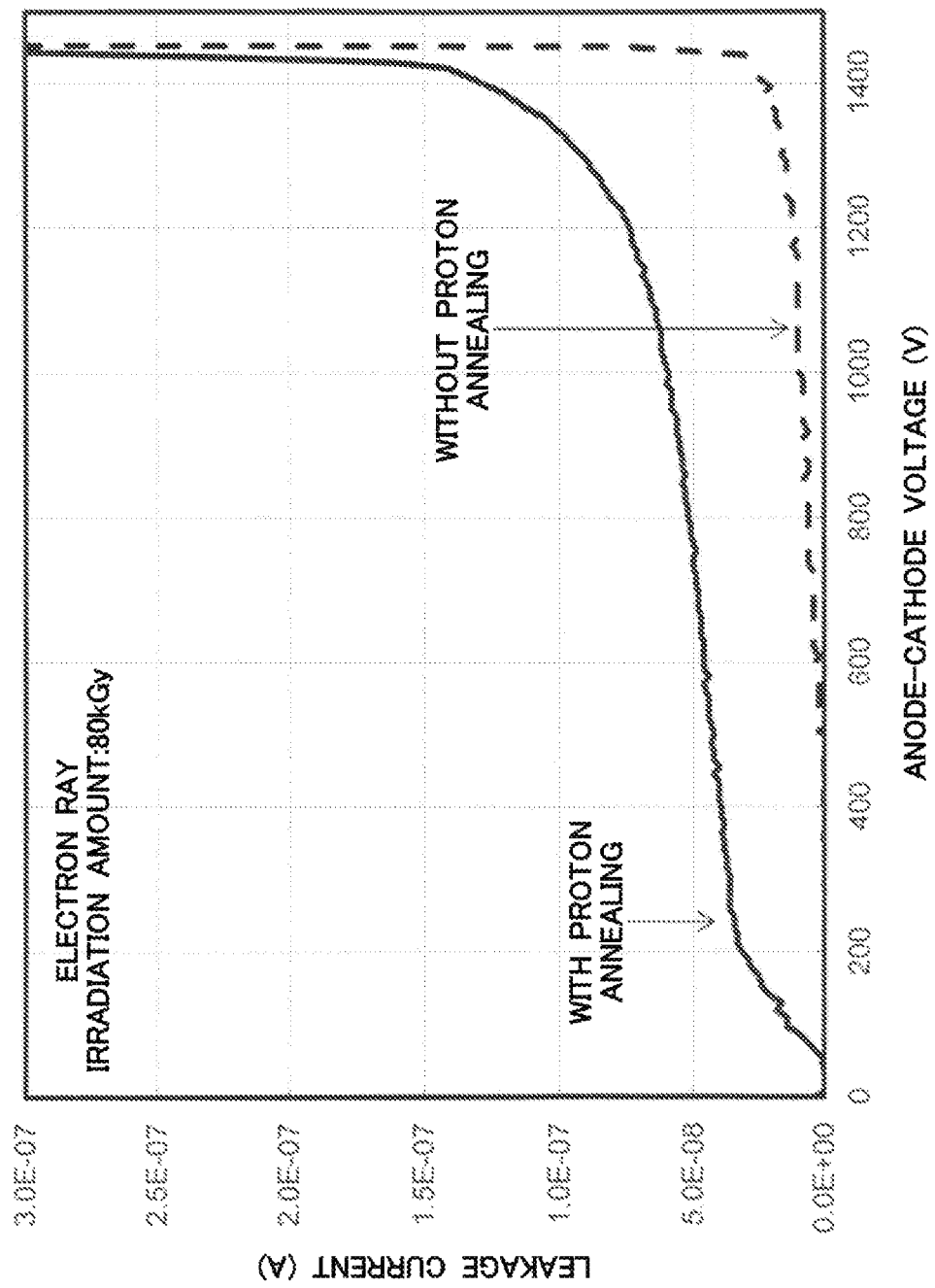
FIG. 8 shows a figure in which a leakage current waveform of a semiconductor device 100 manufactured by performing proton annealing and a leakage current waveform of a semiconductor device 100 manufactured without performing proton annealing are compared with each other.

FIG. 8 shows a figure in which a leakage current waveform of a semiconductor device 100 manufactured by performing proton annealing and a leakage current waveform of a semiconductor device 100 manufactured without performing proton annealing are compared with each other. When lifetime annealing is performed after proton injection and lifetime killer irradiation without performing proton annealing, a large amount of protons is remaining at the time of the lifetime annealing, and almost all crystal defects formed by the lifetime killer irradiation recover. For this reason, there is no effect of the lifetime killer irradiation as shown in FIG. 8. On the other hand, when annealing is performed separately after proton injection and after lifetime killer irradiation, respectively, the remaining amount of protons at the time of lifetime killer annealing can be controlled appropriately. For this reason, control of the carrier lifetime distribution becomes easy.

Figure 9:
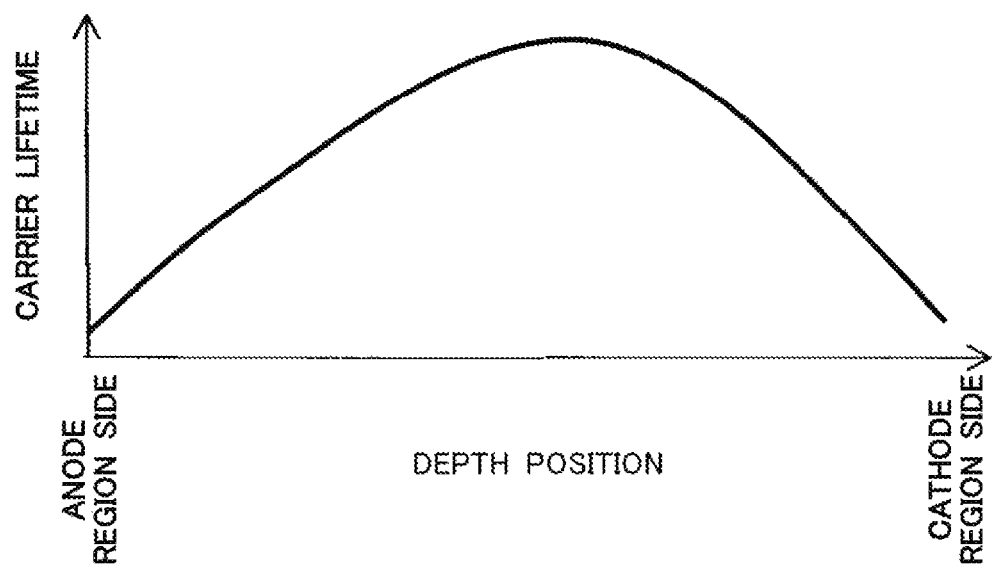
FIG. 9 shows a figure illustrating another exemplary carrier lifetime distribution.

FIG. 9 shows a figure illustrating another exemplary carrier lifetime distribution. In the present example, the carrier lifetime in the cathode region 30 is reduced as compared with that in the distribution shown in FIG. 3. In the semiconductor device 100 of the present example, a local lifetime killer to shorten the carrier lifetime is injected into the rear surface side of the semiconductor substrate 10. The local lifetime killer in the present example is helium. Because the tail current can be made small by reducing the carrier lifetime on the cathode region 30 side as described below, a reverse recovery loss can be decreased.

However, when the depletion layer that expands at the time when a reverse voltage is applied to the semiconductor device 100 expands to a region where the local lifetime killer is present, a leakage current increases significantly. For this reason, a region where the local lifetime killer is present is preferably formed at a depth position that does not contact a depletion layer that expands from the boundary between the anode region 20 and an n-type region of the semiconductor substrate 10 when a rated reverse voltage of the semiconductor device 100 is applied. Also, a region where the local lifetime killer is present may be formed at a depth position that does not contact a depletion layer that expands from the boundary between the anode region 20 and an n-type region of the semiconductor substrate 10 when a breakdown voltage of the semiconductor device 100 is applied.

Figure 10:
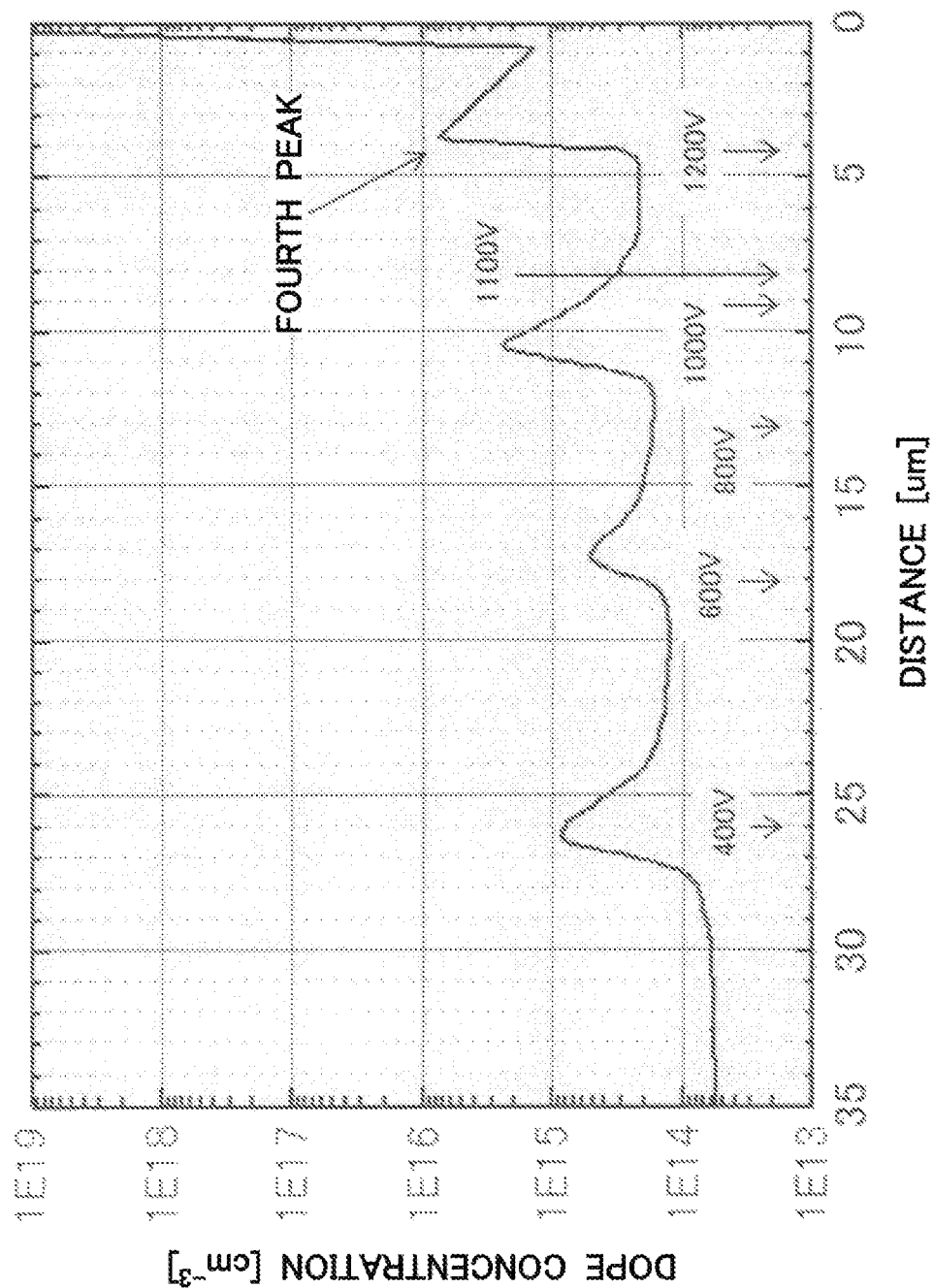
FIG. 10 shows a figure illustrating one exemplary end portion position of a depletion layer when a reverse voltage is applied to the semiconductor device 100.

FIG. 10 shows a figure illustrating one exemplary end portion position of a depletion layer when a reverse voltage is applied to the semiconductor device 100. FIG. 10 shows the dope concentration distribution of impurities together. Also, in FIG. 10, distances, from the rear surface of the semiconductor substrate 10, of depletion layer end portions when reverse voltages are 400 V, 600 V, 800 V, 1000 V, 1100 V and 1200 V are shown.

For example when a reverse voltage of 1200 V is applied, the depletion layer expands from the front surface toward the rear surface of the semiconductor substrate 10, and the depletion layer end reaches the position of 4 µm from the rear surface. In the configuration of the present example, when the rated reverse voltage is 1200 V, the local lifetime killer is preferably neither injected nor diffused to positions deeper than 2.5 µm from the rear surface of the semiconductor substrate 10, for example.

When the local lifetime killer is injected to shallow positions from the rear surface of the semiconductor substrate 10 in this manner, the local lifetime killer injection position overlaps the fourth peak position of the proton injection. Crystal defects that have occurred due to helium irradiation are influenced by defect recovery due to protons in a similar manner to electron ray irradiation. For this reason, the local lifetime killer injection amount is preferably adjusted according to the proton injection amount in the region.

Figure 11:
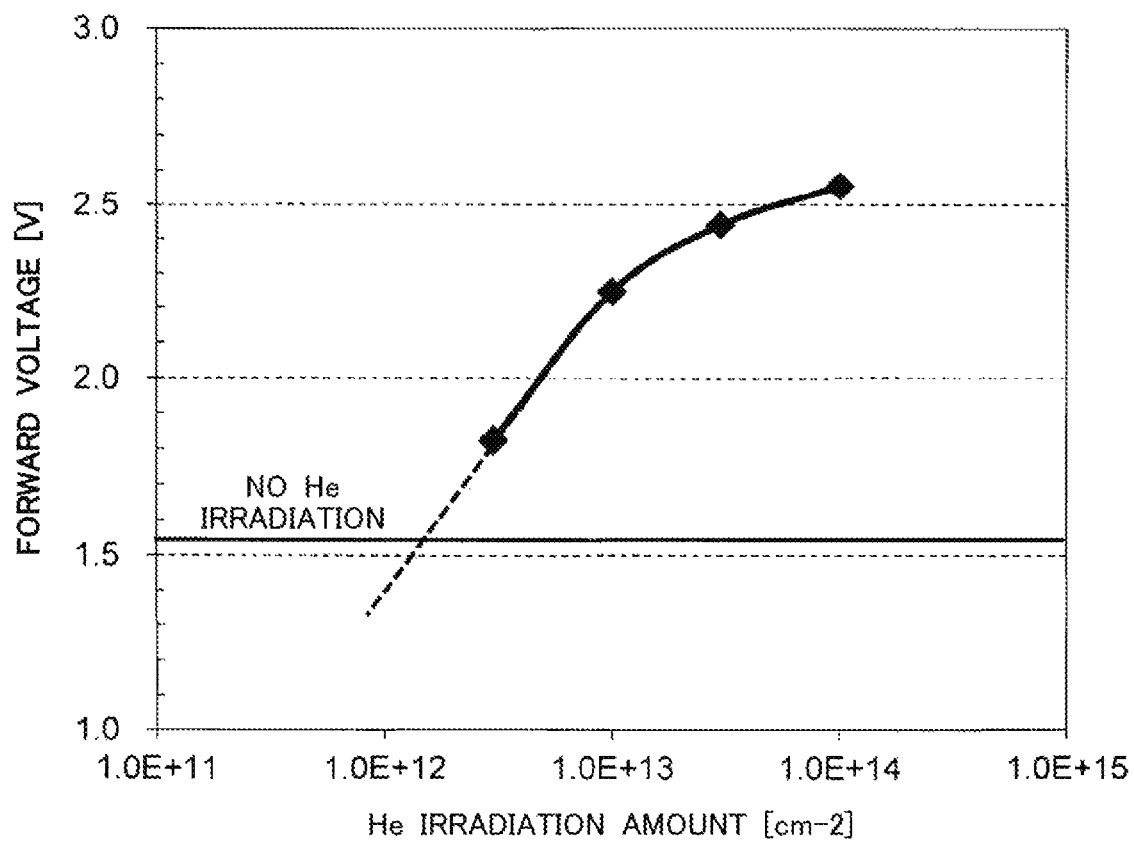
FIG. 11 shows a figure illustrating one exemplary relationship between the irradiation amount of helium as a local lifetime killer and forward voltage of the semiconductor device 100.

FIG. 11 shows a figure illustrating one exemplary relationship between the irradiation amount of helium as a local lifetime killer and forward voltage of the semiconductor device 100. The forward voltage in a case where irradiation with helium was not performed was approximately 1.5 to 1.6 V.

In the present example, the proton injection amount at the fourth peak is $3E14$ $cm^{-2}$. In contrast to this, as shown in FIG. 11, with a range of the helium irradiation amount smaller than $1E12$ $cm^{-2}$, increase in the forward voltage is not observed as compared with a case where irradiation with helium was not performed. This is deemed to be attributable to the fact that almost all the defects due to helium irradiation are hydrogen-terminated by protons because the helium irradiation amount was too small as compared with the proton injection amount. Accordingly, the local lifetime killer injection amount is preferably 1/300 or more of the proton injection amount. The local lifetime killer injection amount may be 1/150 or more, or 1/100 or more of the proton injection amount. Also, the local lifetime killer injection amount is preferably 1/3 or less of the proton injection amount.

Figure 12:
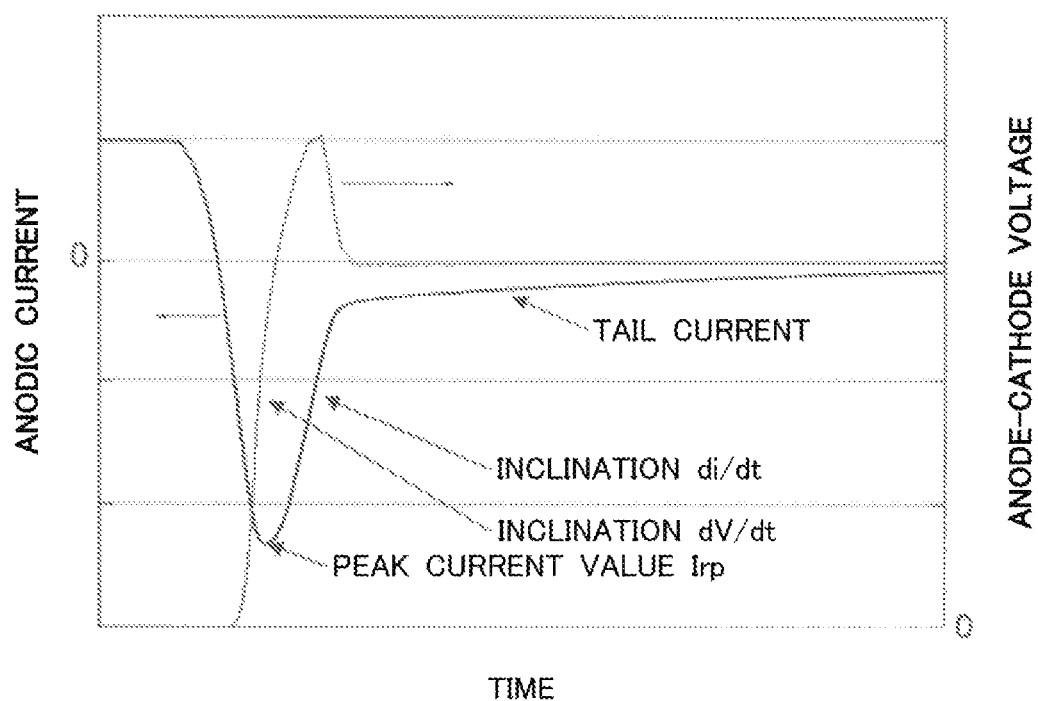
FIG. 12 shows a figure illustrating exemplary temporal waveforms of anode-cathode voltage and anodic current at the time of reverse recovery.

FIG. 12 shows a figure illustrating exemplary temporal waveforms of anode-cathode voltage and anodic current at the time of reverse recovery. In the semiconductor device 100, a reverse recovery loss can be decreased by making the peak current value Irp and the tail current shown in FIG. 12 small. Also, by making the inclination dV/dt of the anode-cathode voltage steep, reverse recovery can be made gentle.

Figure 13:
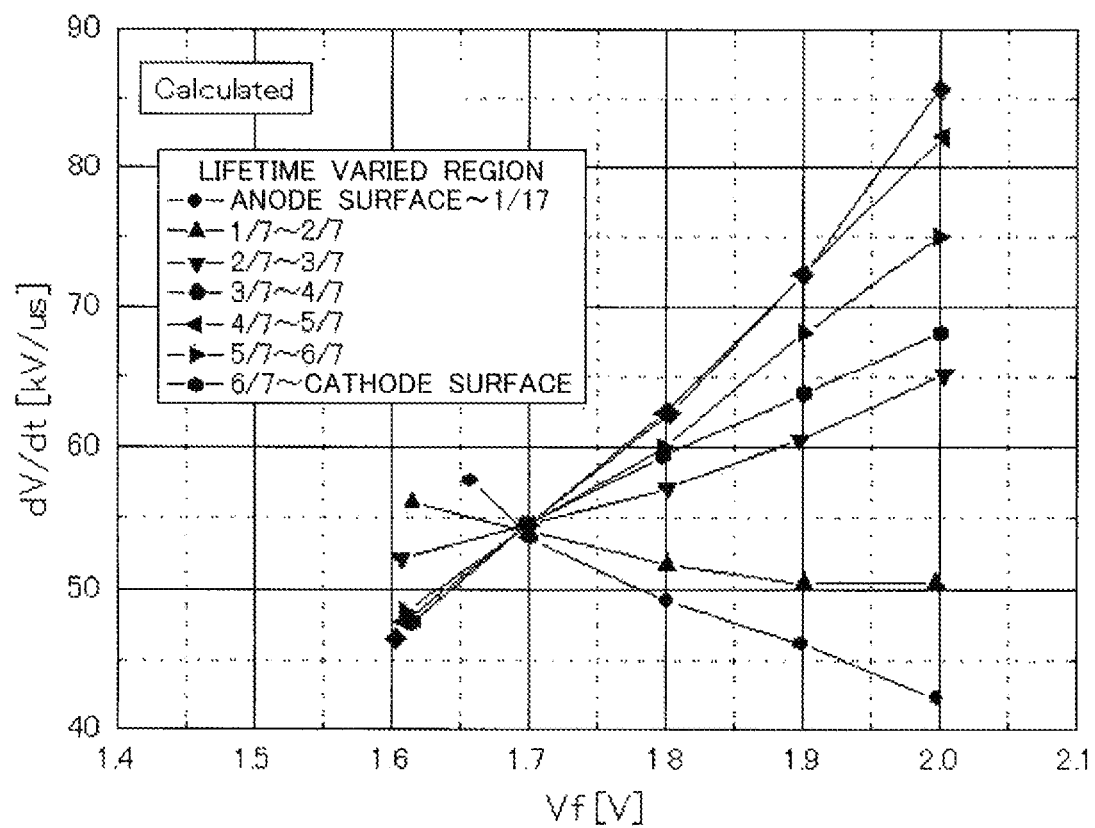
FIG. 13 shows a figure illustrating the relationship between forward voltage and dV/dt when the semiconductor substrate 10 is divided into seven regions in its depth direction, and the carrier lifetimes of the respective regions are varied.

FIG. 13 shows a figure illustrating the relationship between forward voltage and dV/dt when the semiconductor substrate 10 is divided into seven regions in its depth direction, and the carrier lifetimes of the respective regions are varied. In the example shown in FIG. 13, the relationship is calculated by device simulation. Generally, the shorter the carrier lifetime, the higher the forward voltage Vf.

Figure 14A:
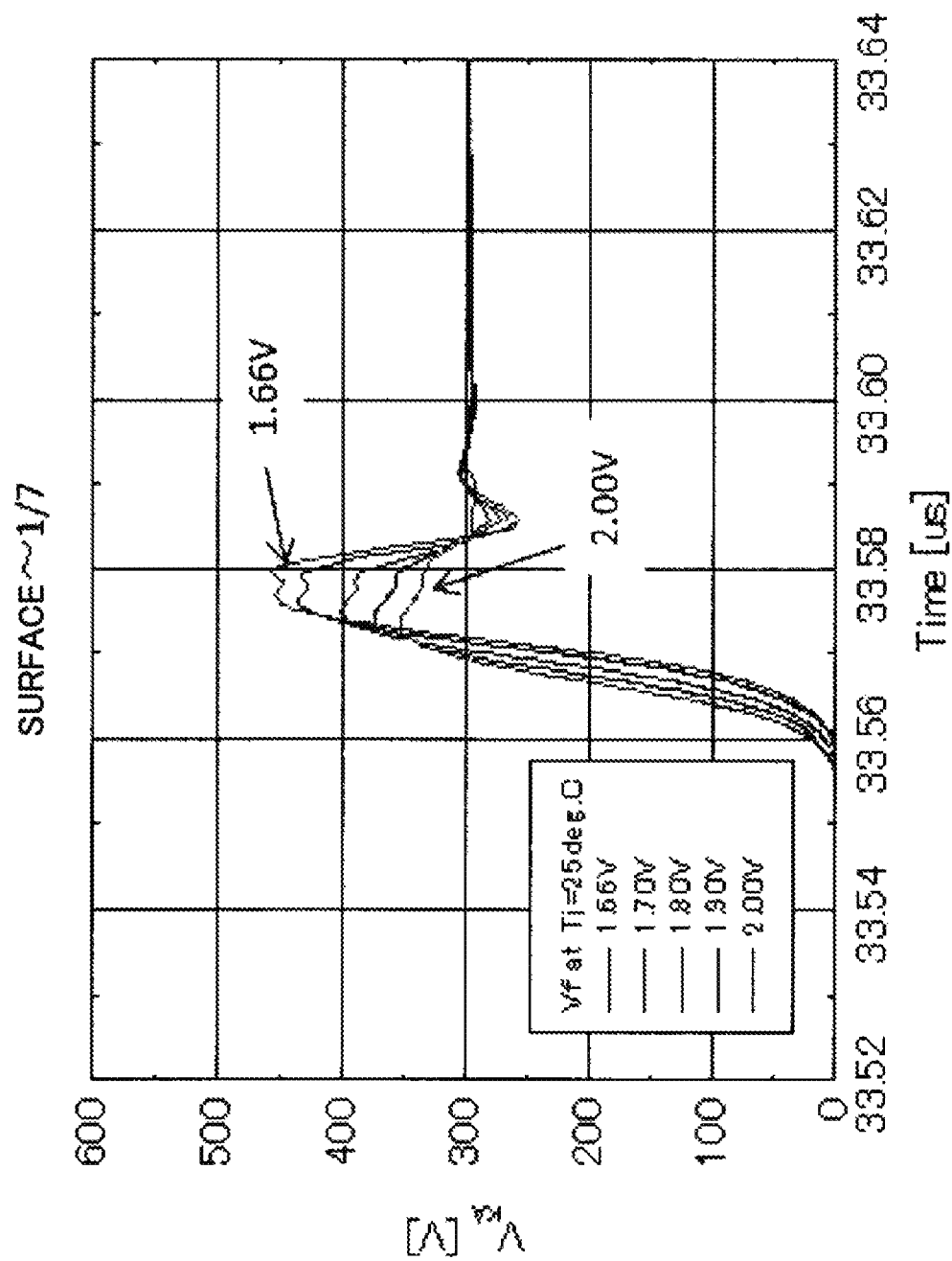
FIG. 14A shows the relationship between the carrier lifetime (forward voltage) of a region from the front surface to the depth of 1/7 of the semiconductor substrate 10, and a temporal waveform of anode-cathode voltage $V_{KA}$.
Figure 14B:
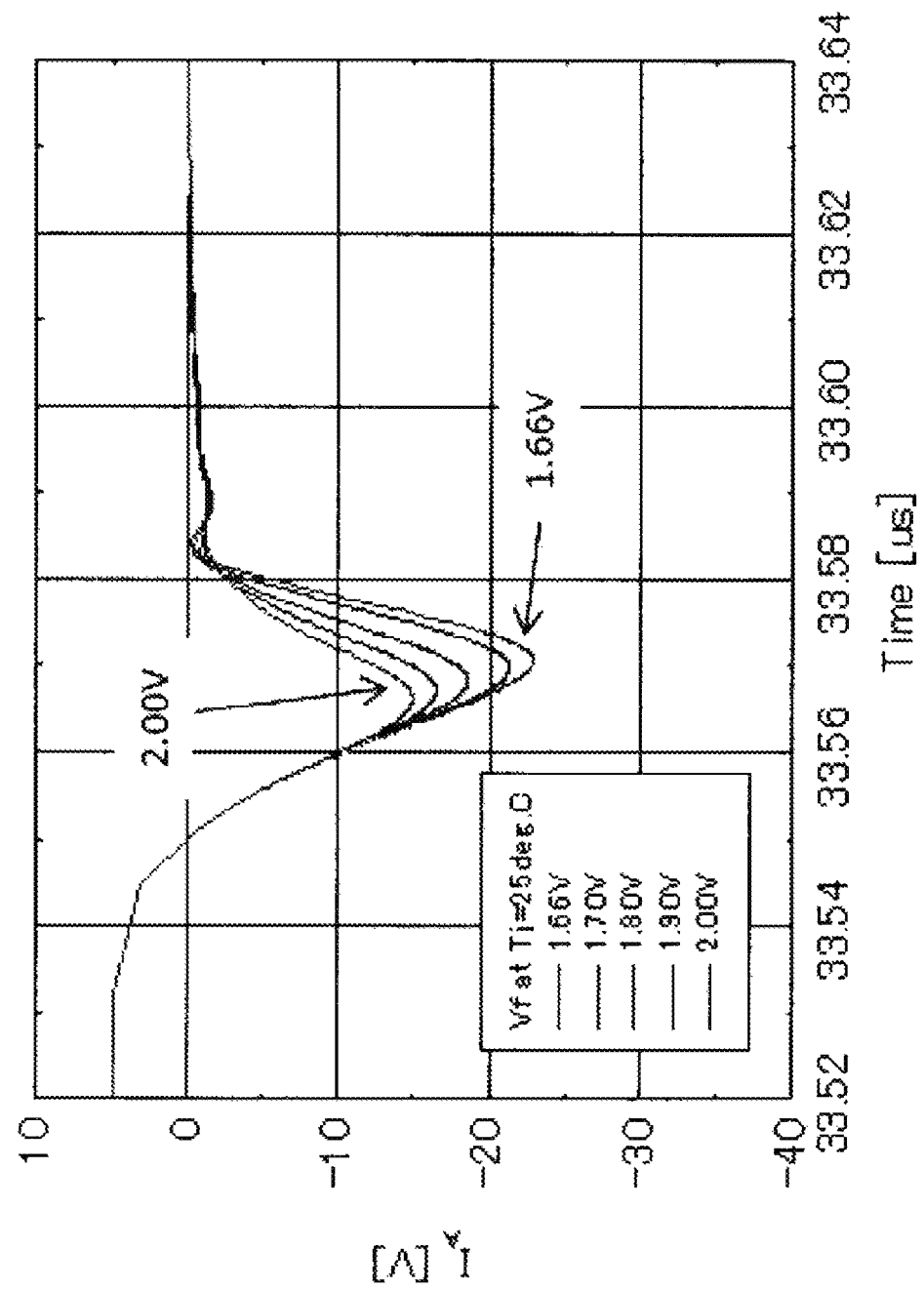
FIG. 14B shows the relationship between the carrier lifetime (forward voltage) of a region from the front surface to the depth of 1/7 of the semiconductor substrate 10, and a temporal waveform of anode current $I_A$.

FIG. 14A shows the relationship between forward voltage Vf at the time when the carrier lifetime of a region from the front surface to the depth of 1/7 of the semiconductor substrate 10 is varied, and a temporal waveform of anode-cathode voltage $V_{KA}$. FIG. 14B shows the relationship between forward voltage Vf at the time when the carrier lifetime of a region from the front surface to the depth of 1/7 of the semiconductor substrate 10 is varied, and a temporal waveform of anode current $I_A$. FIG. 14A to FIG. 20B show examples in the cases of Vf=1.66 V, 1.70 V, 1.80 V, 1.90 V and 2.00 V. Respective figures show graphs in the cases of Vf=1.66 V and 2.00 V with arrows, and graphs in the cases of Vf=1.70 V, 1.80 V and 1.90 V are arranged in the descending order of the magnitude of Vf between the graphs in the cases of Vf=1.66 V and 2.00 V.

Figure 15A:
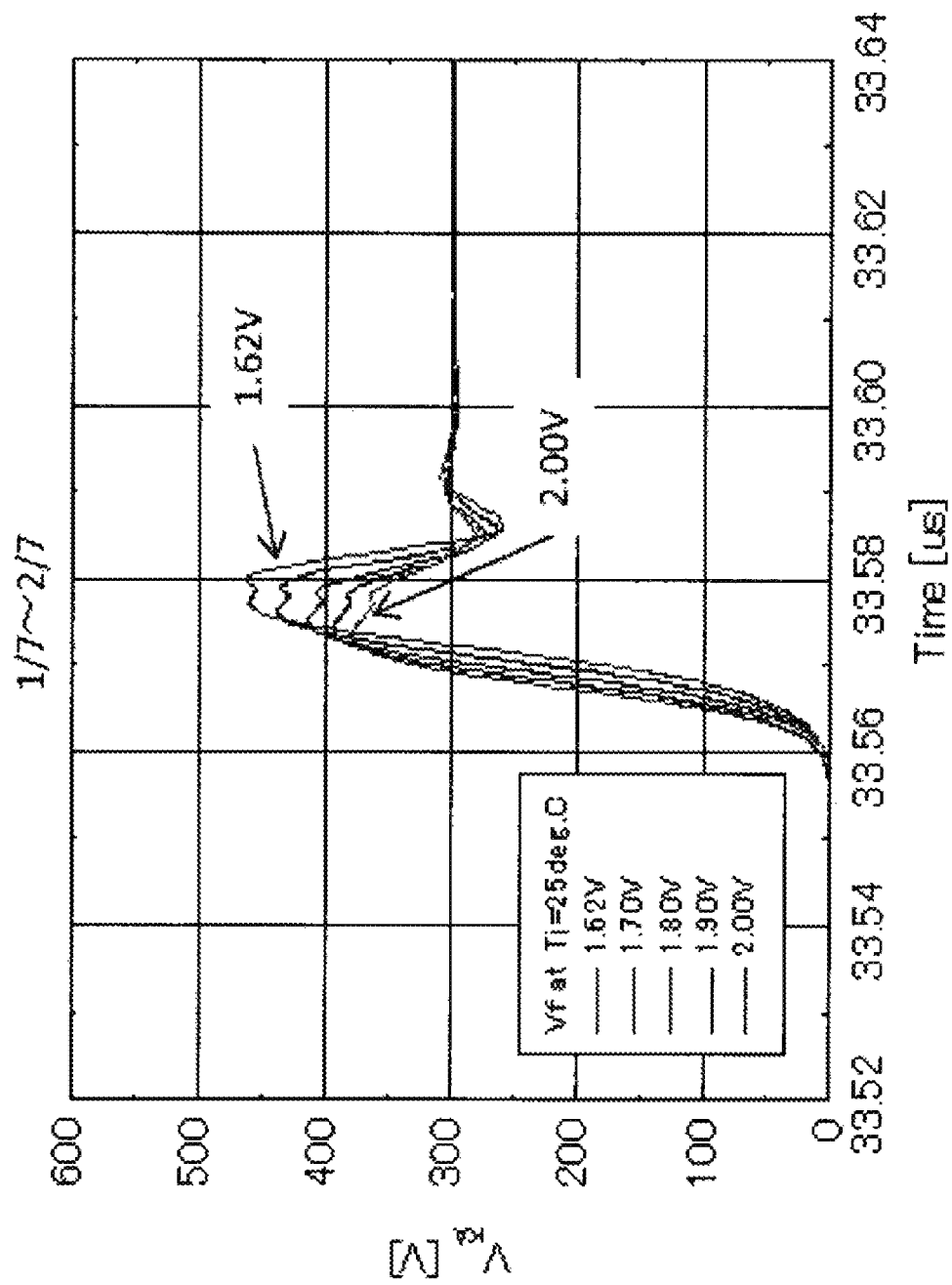
FIG. 15A shows the relationship between the carrier lifetime (forward voltage) of a depth region from 1/7 to 2/7 and a temporal waveform of anode-cathode voltage $V_{KA}$.
Figure 15B:
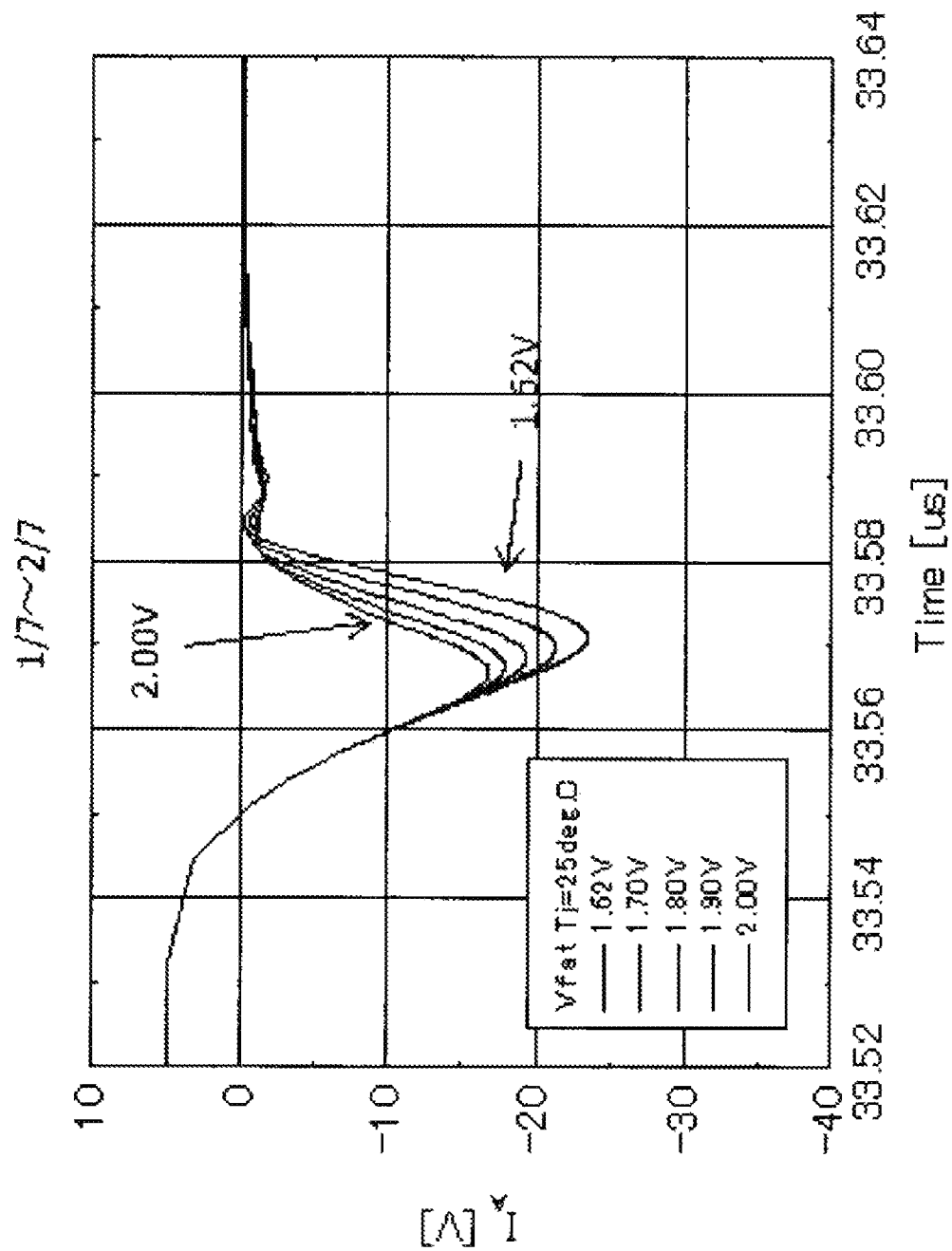
FIG. 15B shows the relationship between the carrier lifetime (forward voltage) of a depth region from 1/7 to 2/7 from the front surface of the semiconductor substrate 10, and a temporal waveform of anode current $I_A$.

FIG. 15A shows the relationship between forward voltage Vf at the time when the carrier lifetime of a depth region from 1/7 to 2/7 is varied, and a temporal waveform of anode-cathode voltage $V_{KA}$. FIG. 15B shows the relationship between forward voltage Vf at the time when the carrier lifetime of a depth region from 1/7 to 2/7 from the front surface of the semiconductor substrate 10 is varied, and a temporal waveform of anode current $I_A$.

Figure 16A:
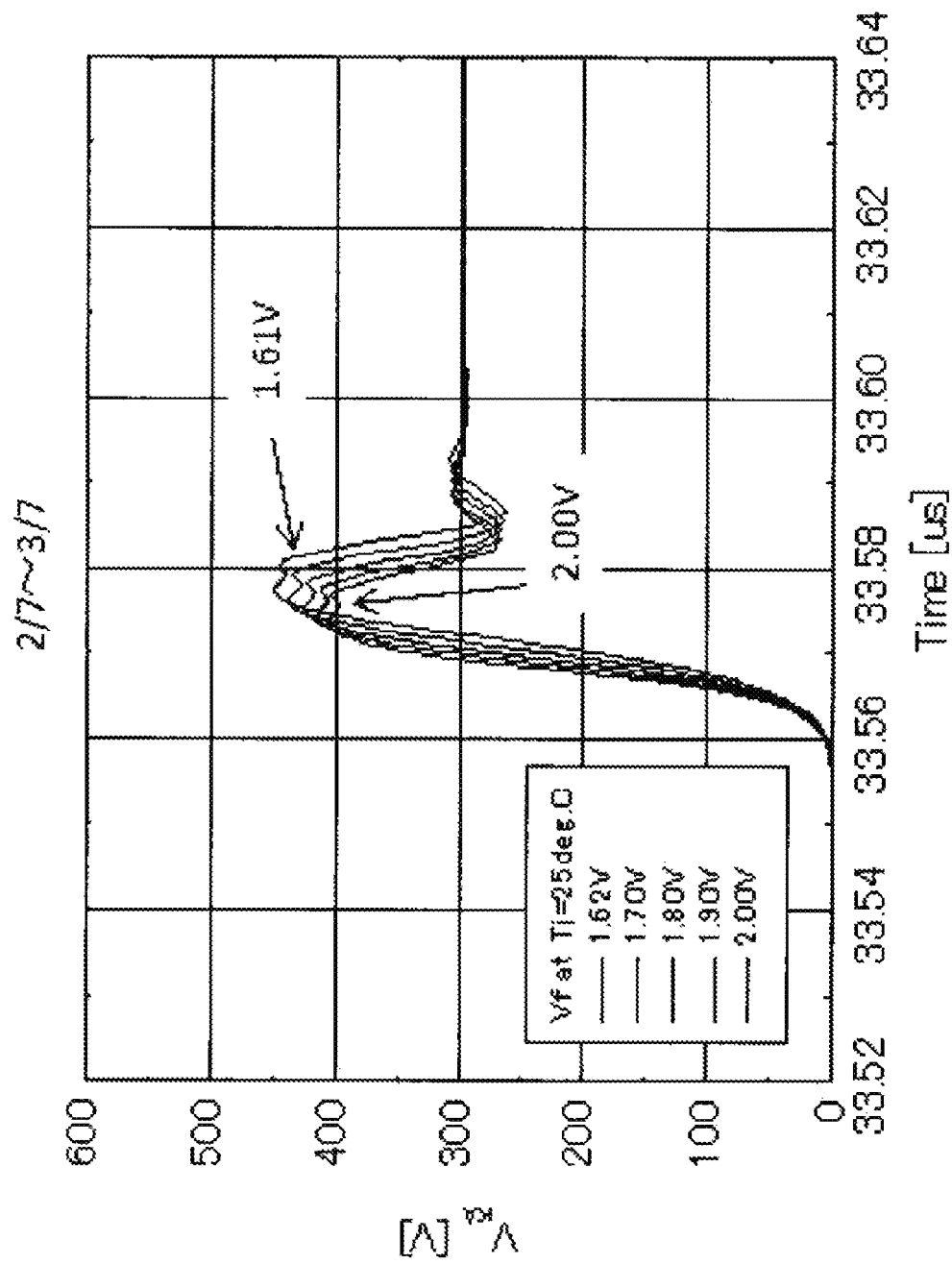
FIG. 16A shows the relationship between the carrier lifetime (forward voltage) of a depth region from 2/7 to 3/7 and a temporal waveform of anode-cathode voltage $V_{KA}$.
Figure 16B:
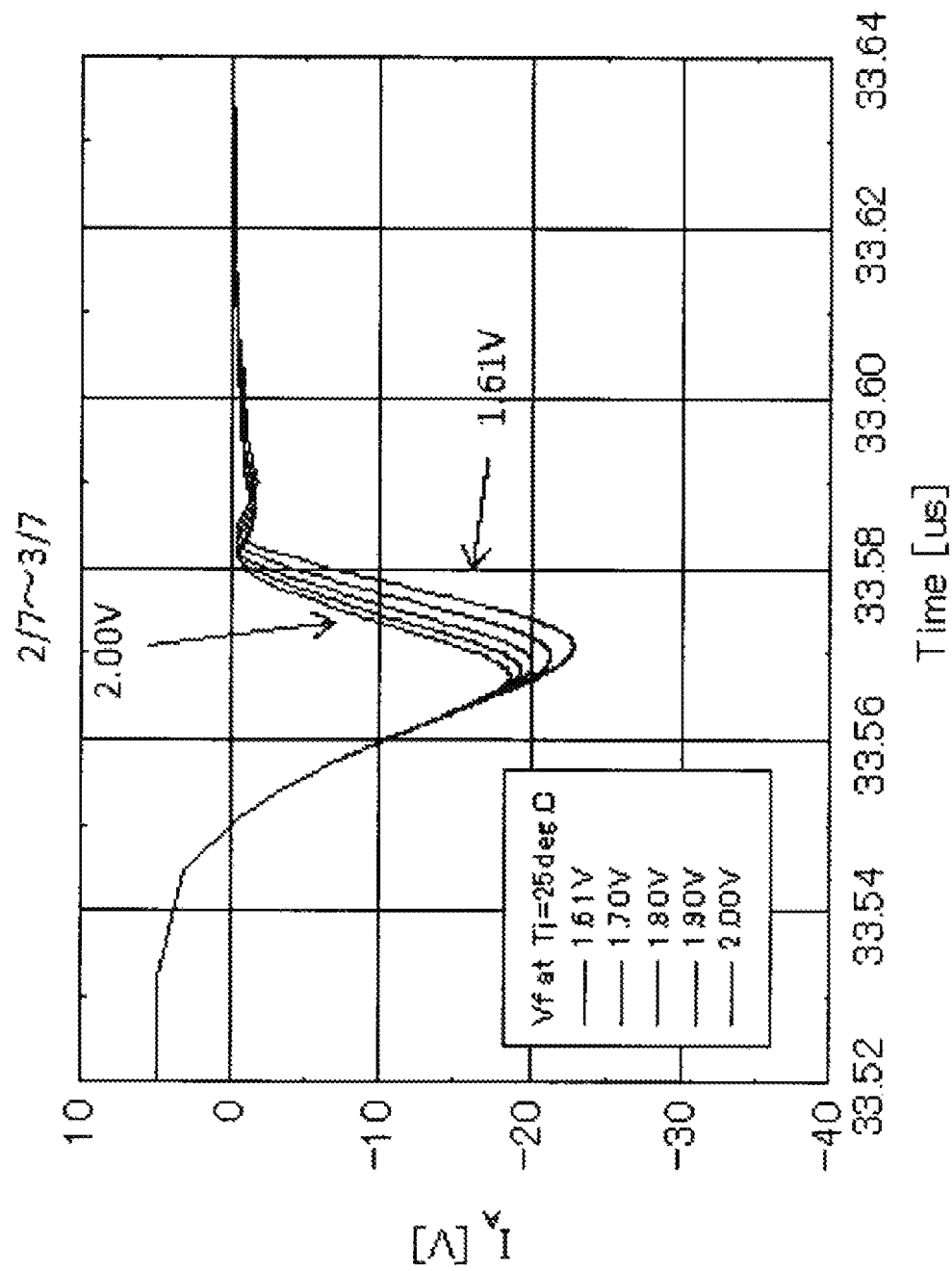
FIG. 16B shows the relationship between the carrier lifetime (forward voltage) of a depth region from 2/7 to 3/7 from the front surface of the semiconductor substrate 10, and a temporal waveform of anode current $I_A$.

FIG. 16A shows the relationship between forward voltage Vf at the time when the carrier lifetime of a depth region from 2/7 to 3/7 is varied, and a temporal waveform of anode-cathode voltage $V_{KA}$. FIG. 16B shows the relationship between forward voltage Vf at the time when the carrier lifetime of a depth region from 2/7 to 3/7 from the front surface of the semiconductor substrate 10 is varied, and a temporal waveform of anode current $I_A$.

Figure 17A:
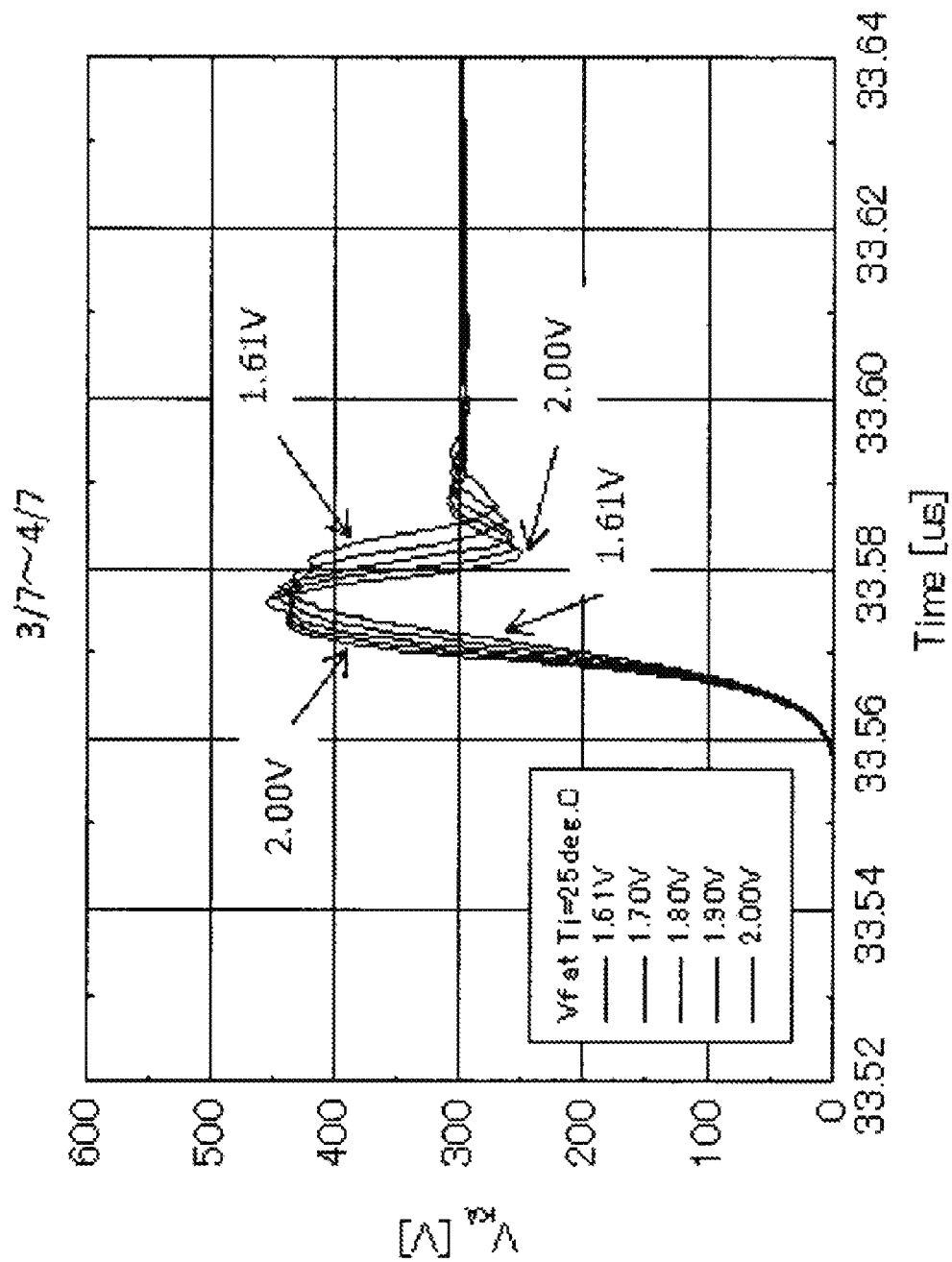
FIG. 17A shows the relationship between the carrier lifetime (forward voltage) of a depth region from 3/7 to 4/7 and a temporal waveform of anode-cathode voltage $V_{KA}$.
Figure 17B:
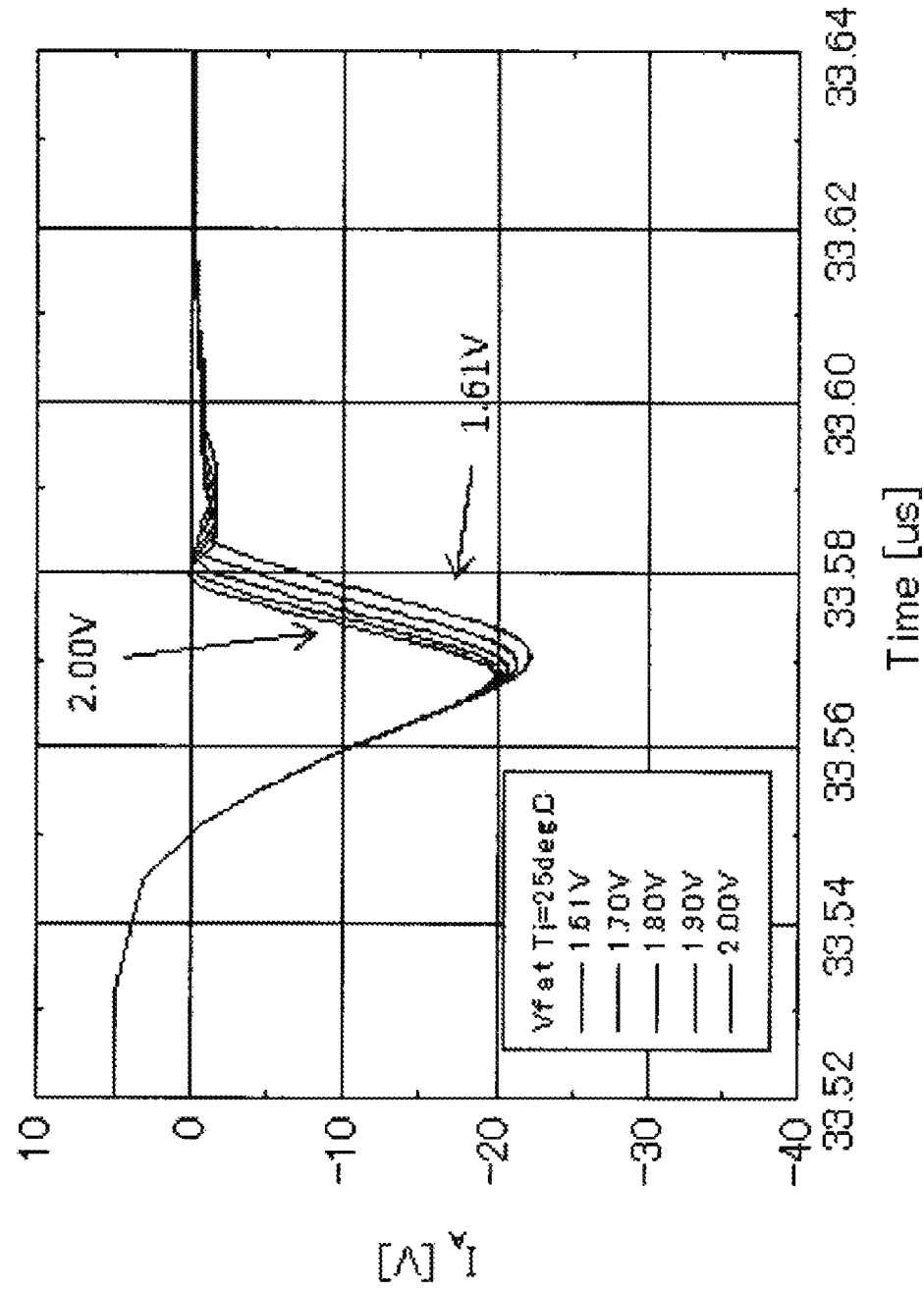
FIG. 17B shows the relationship between the carrier lifetime (forward voltage) of a depth region from 3/7 to 4/7 from the front surface of the semiconductor substrate 10, and a temporal waveform of anode current $I_A$.

FIG. 17A shows the relationship between forward voltage Vf at the time when the carrier lifetime of a depth region from 3/7 to 4/7 is varied, and a temporal waveform of anode-cathode voltage $V_{KA}$. FIG. 17B shows the relationship between forward voltage Vf at the time when the carrier lifetime of a depth region from 3/7 to 4/7 from the front surface of the semiconductor substrate 10 is varied, and a temporal waveform of anode current $I_A$.

Figure 18A:
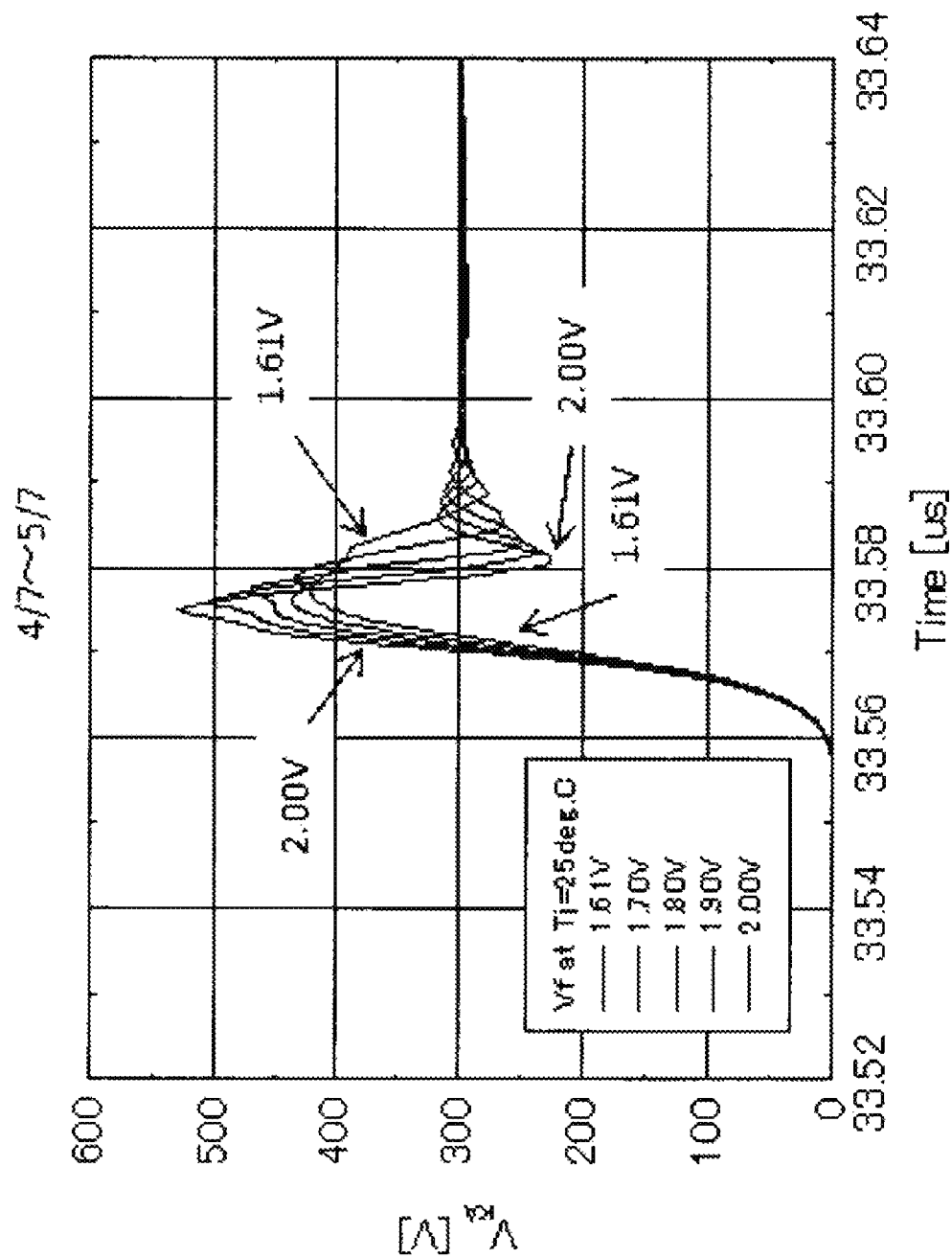
FIG. 18A shows the relationship between the carrier lifetime (forward voltage) of a depth region from 4/7 to 5/7 and a temporal waveform of anode-cathode voltage $V_{KA}$.
Figure 18B:
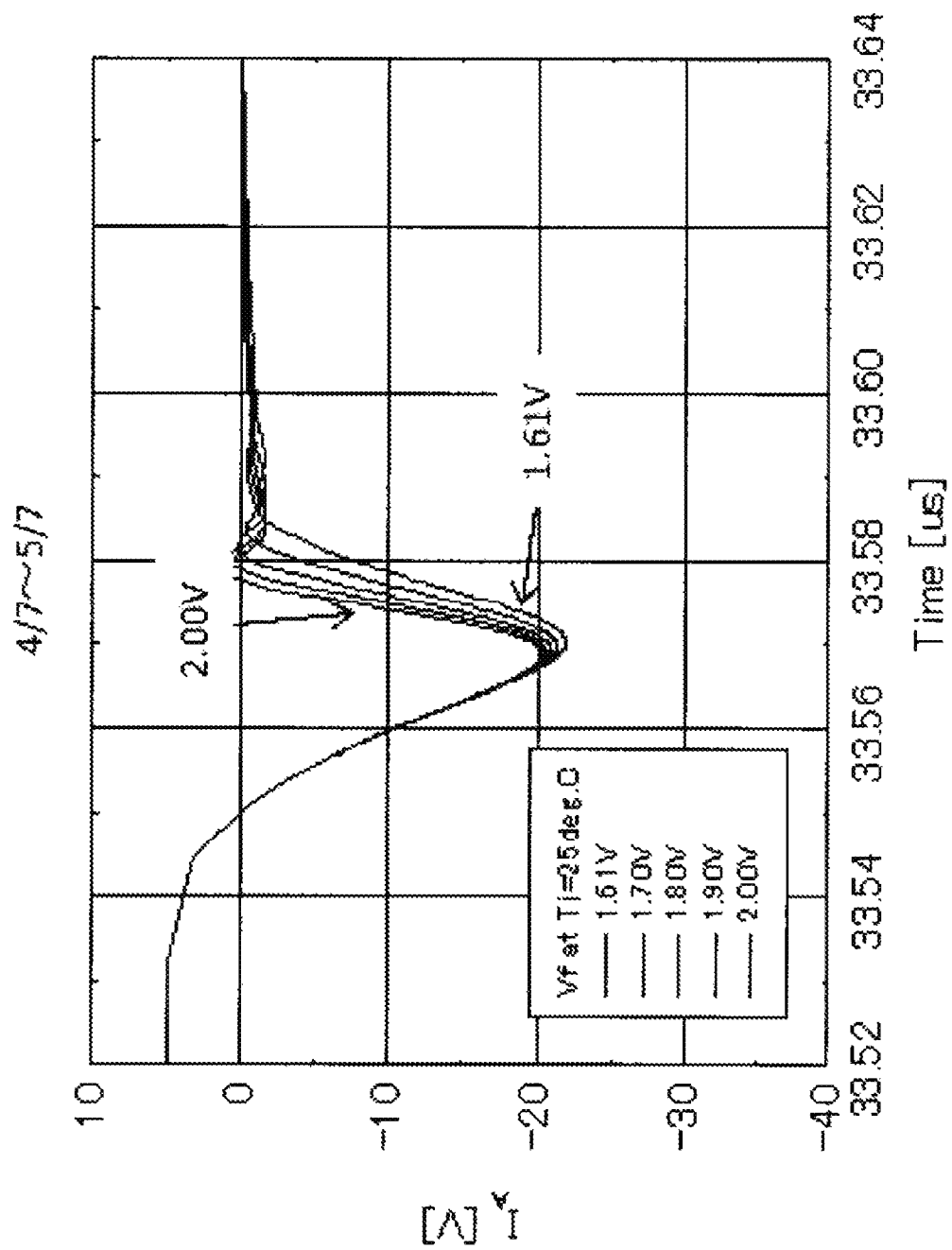
FIG. 18B shows the relationship between the carrier lifetime (forward voltage) of a depth region from 4/7 to 5/7 from the front surface of the semiconductor substrate 10, and a temporal waveform of anode current $I_A$.

FIG. 18A shows the relationship between forward voltage Vf at the time when the carrier lifetime of a depth region from 4/7 to 5/7 is varied, and a temporal waveform of anode-cathode voltage $V_{KA}$. FIG. 18B shows the relationship between forward voltage Vf at the time when the carrier lifetime of a depth region from 4/7 to 5/7 from the front surface of the semiconductor substrate 10 is varied, and a temporal waveform of anode current $I_A$.

Figure 19A:
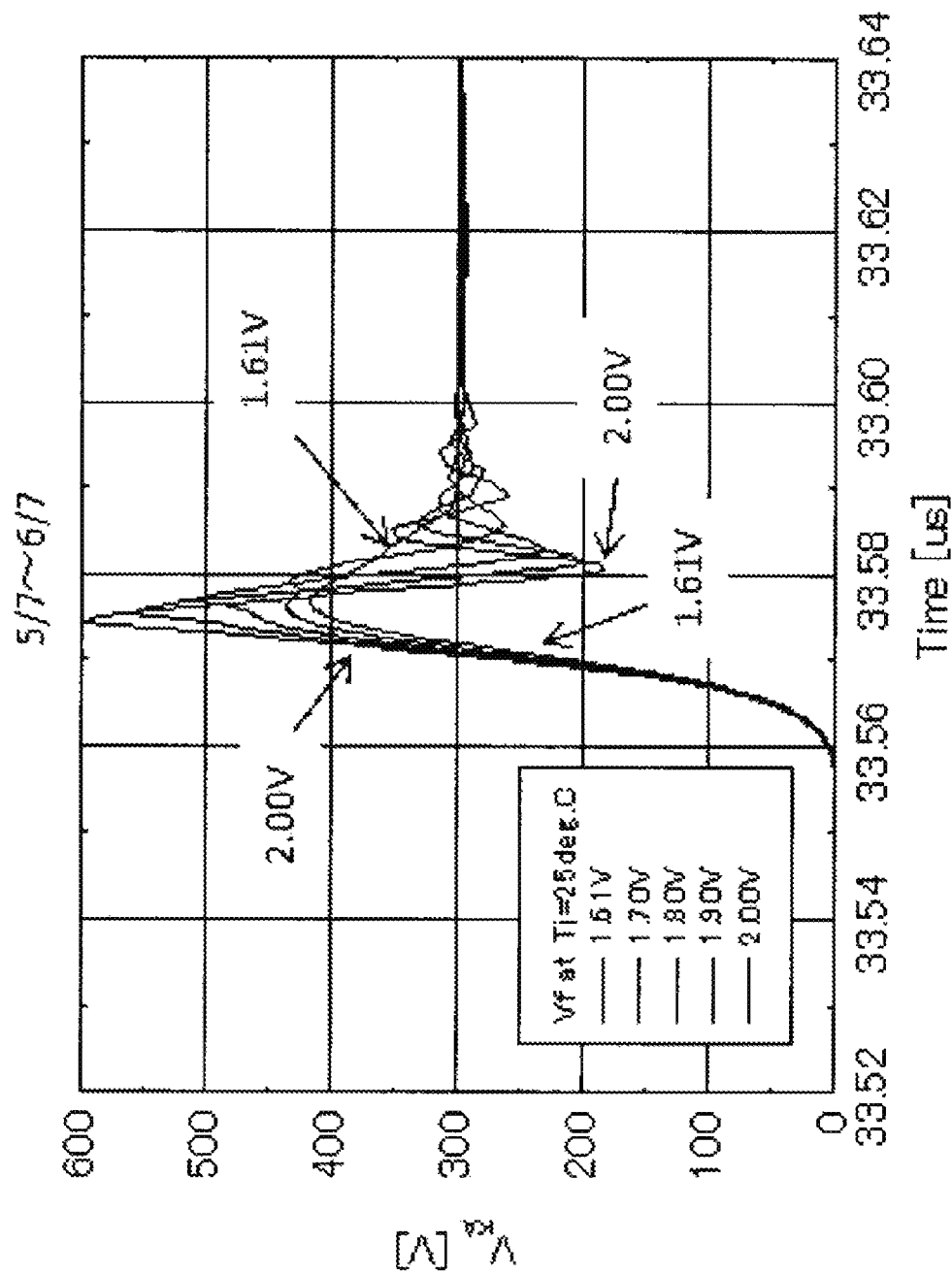
FIG. 19A shows the relationship between the carrier lifetime (forward voltage) of a depth region from 5/7 to 6/7 and a temporal waveform of anode-cathode voltage $V_{KA}$.
Figure 19B:
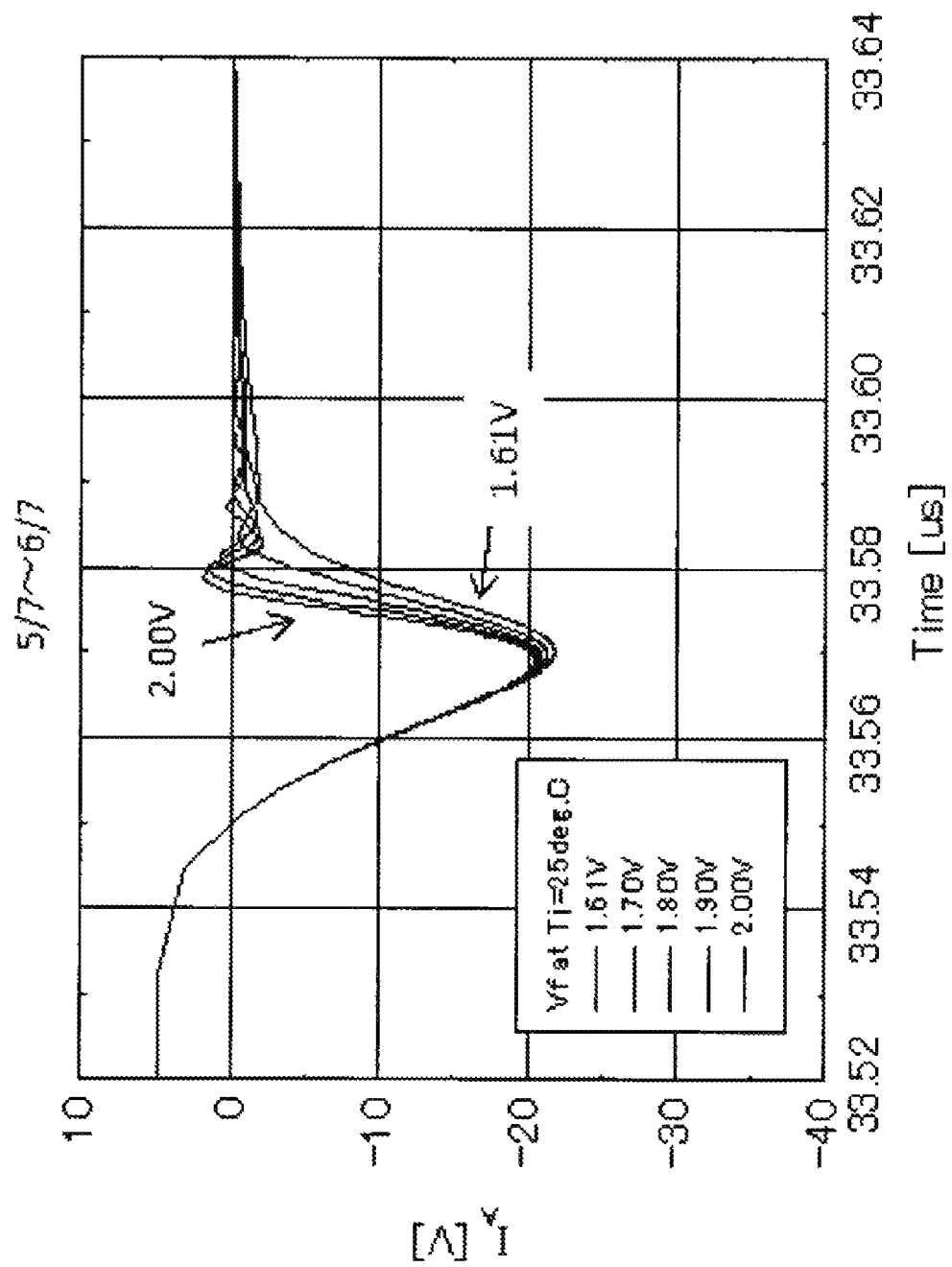
FIG. 19B shows the relationship between the carrier lifetime (forward voltage) of a depth region from 5/7 to 6/7 from the front surface of the semiconductor substrate 10, and a temporal waveform of anode current $I_A$.

FIG. 19A shows the relationship between forward voltage Vf at the time when the carrier lifetime of a depth region from 5/7 to 6/7 is varied, and a temporal waveform of anode-cathode voltage $V_{KA}$. FIG. 19B shows the relationship between forward voltage Vf at the time when the carrier lifetime of a depth region from 5/7 to 6/7 from the front surface of the semiconductor substrate 10 is varied, and a temporal waveform of anode current $I_A$.

Figure 20A:
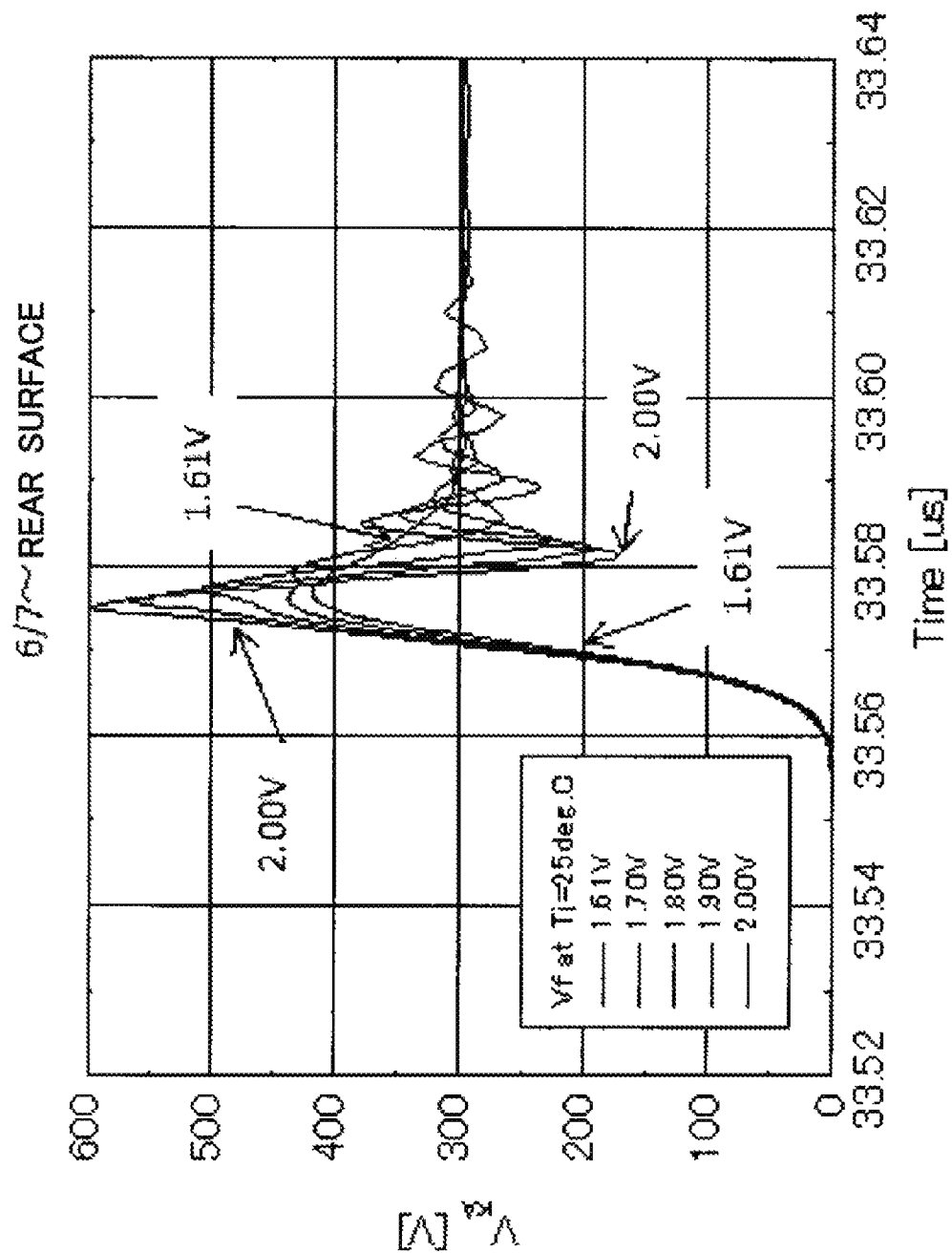
FIG. 20A shows the relationship between the carrier lifetime (forward voltage) of a depth region from 6/7 to the rear surface of the semiconductor substrate 10, and a temporal waveform of anode-cathode voltage $V_{KA}$.

FIG. 20A shows the relationship between forward voltage Vf at the time when the carrier lifetime of a depth region from 6/7 to the rear surface of the semiconductor substrate 10 is varied, and a temporal waveform of anode-cathode voltage $V_{KA}$. FIG. 20B shows the relationship between forward voltage Vf at the time when the carrier lifetime of a depth region from 6/7 to the rear surface of the semiconductor substrate 10 is varied, and a temporal waveform of anode current $I_A$.

The following knowledge can be gained from FIG. 13 to FIG. 20A.

In the region from the front surface (the anode side front surface) to 3/7 of the semiconductor substrate 10, fluctuation of the forward voltage Vf has large influence on Irp. On the other hand, even when the forward voltage Vf increases, dV/dt tends to decrease. For this reason, in this region, the carrier lifetime is preferably short so as to reduce Irp.

In the region from 3/7 to 5/7 from the front surface of the semiconductor substrate 10, fluctuation of the forward voltage Vf has large influence on dV/dt. For this reason, the carrier lifetime of this region is preferably long so as to realize gentle dV/dt.

In the region from 5/7, from the front surface of the semiconductor substrate 10, to the rear surface (the cathode side front surface) of the semiconductor substrate 10, fluctuation of the forward voltage Vf has large influence on a tail current. For this reason, the carrier lifetime is favorably short in order to make the tail current small. On the other hand, if the carrier lifetime is too short, carriers on the cathode side decrease so much that an oscillation phenomenon of voltage and current may occur at the time of reverse recovery. For this reason, the carrier lifetime of this region may be shorter than that in the region from 3/7 to 5/7, and longer than that in the region from the front surface of the semiconductor substrate 10 to 3/7.

The above-mentioned phenomenon can be understood also as follows. At the time of reverse recovery, the depletion layer expands from the anode region 20 side. Carriers that have been present in the region of the depletion layer are expelled to become a reverse recovery current. Accordingly, if there is a lot of carriers on the front surface side of the semiconductor substrate 10, it becomes more likely that the peak Irp of current to flow first becomes higher.

Also, carriers present in the region between the depletion layer and the rear surface of the semiconductor substrate 10 in a state where expansion of the depletion layer is stopped flows as a tail current. For this reason, if there is a lot of carriers on the rear surface side of the semiconductor substrate 10, it becomes more likely that a tail current becomes larger.

Also, when the semiconductor device 100 is used as a free wheeling diode such as an IGBT, the IGBT or the like draws a predetermined current from the semiconductor device 100. At this time, if a lot of carriers is present in the semiconductor substrate 10, the current can be supplied to the IGBT or the like even if the depletion layer expands slowly. On the other hand, when the number of carriers is small, the depletion layer expands fast in order to supply the current, and the inclination dV/dt of the reverse recovery voltage becomes steep. For this reason, when the number of carriers in a region in the middle of the semiconductor substrate 10 through which the depletion layer expands is large, the inclination of dV/dt of reverse recovery voltage becomes less steep.

Also, the first peak is preferably provided at a position corresponding to an end portion of the above-mentioned depletion layer on the rear surface side of the semiconductor substrate 10 when the inter-electrode voltage of the diode at the time of reverse recovery of the semiconductor device 100 becomes the half value of an applied voltage. Generally, an applied voltage at the time of reverse recovery is often set to be approximately the half of the withstand voltage of an element. For example, a 1200-V withstand voltage element is reverse-recovered at an applied voltage of 600 V. The moment when dV/dt becomes the largest at the time of reverse recovery is when the anode-cathode voltage becomes the half of an applied voltage. By locating the first peak at a position where the depletion layer is expanding at the time of the anode-cathode voltage, dV/dt can be made small efficiently.

In the semiconductor device 100 of the present example, the carrier lifetime is caused to recover by injecting protons to form the FS region 40, and at the same time diffusing the protons. Because in the present example, the distribution of protons is like the one shown in FIG. 2 or the like, as shown in FIG. 3 or FIG. 9, the distribution of the carrier lifetime having a peak in the middle of the semiconductor substrate 10 can be formed. Thanks to the distribution of the carrier lifetime, as explained with reference to FIG. 13 to FIG. 20A, the small peak current Irp, the small tail current and the gentle inclination dV/dt of reverse recovery voltage can be realized.

Figure 21:
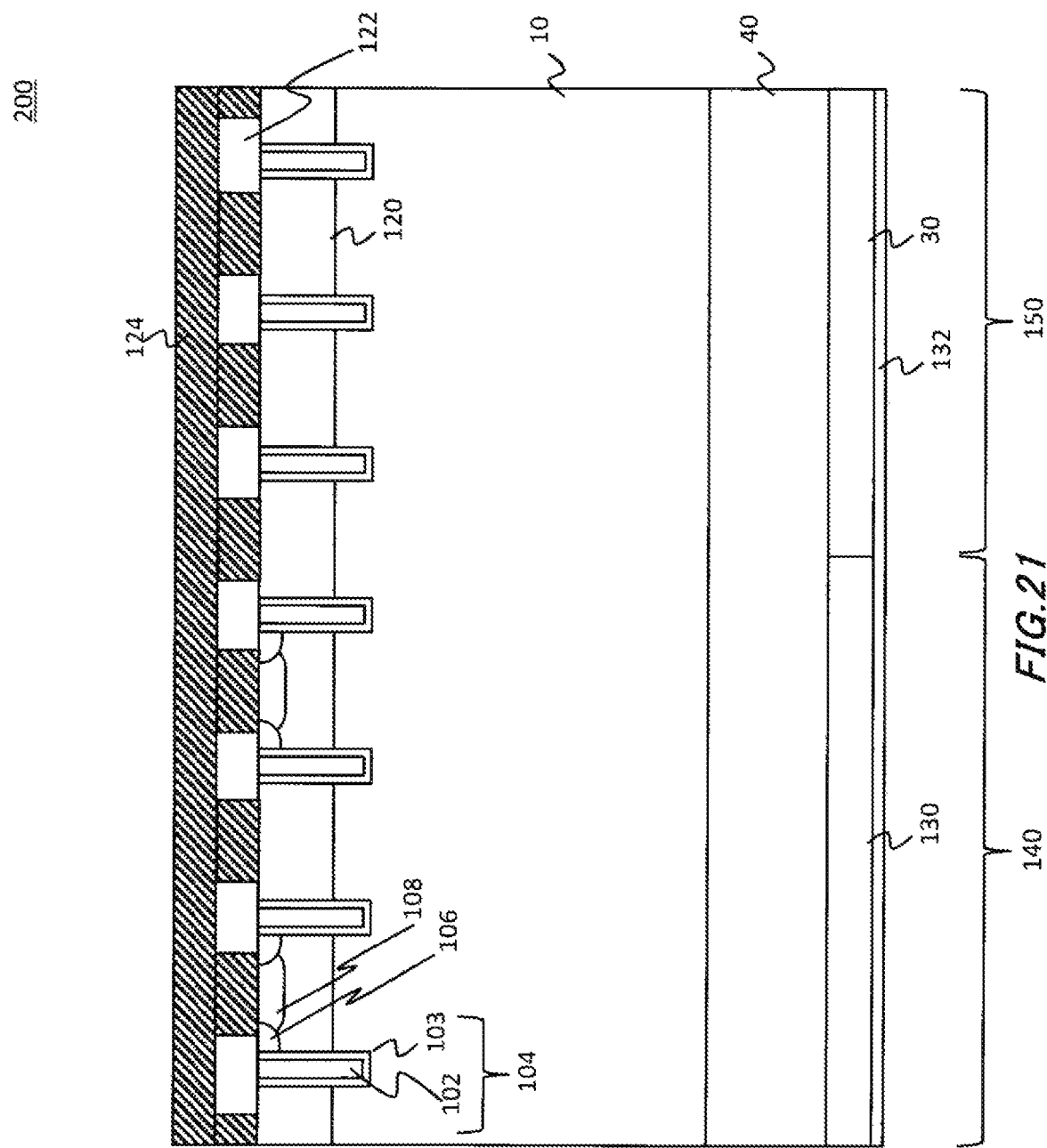
FIG. 21 shows a figure illustrating a configuration example of a semiconductor device 200 according to another embodiment.

FIG. 21 shows a figure illustrating a configuration example of a semiconductor device 200 according to another embodiment. The semiconductor device 200 of the present example is an RC-IGBT device in which an IGBT element 140 and a FWD element 150 connected in anti-parallel are formed integrally. The semiconductor device 200 comprises the semiconductor substrate 10, an insulation film 122, an emitter anode electrode 124 and a collector cathode electrode 132.

The semiconductor substrate 10 has p-type regions 120 formed on its front surface side. Also, the semiconductor substrate 10 has a plurality of trenches 104 formed to penetrate the p-type regions 120 from the front surface of the semiconductor substrate 10. The leading end of each trench 104 on the rear surface side of the semiconductor substrate 10 protrudes past the end portions of the p-type regions 120. Each trench 104 has a trench gate 102 formed to penetrate the p-type region 120 from the front surface of the semiconductor substrate 10. Also, each trench gate 102 and each semiconductor layer are insulated by an insulation film 103.

Also, among the plurality of p-type regions 120 separated by the trenches 104, in some of the p-type regions 120 corresponding to the IGBT element 140, $n^+$-type regions 106 and $p^+$-type region 108 are formed. The $n^+$-type regions 106 are provided adjacent to the trenches 104 on the front surface of the p-type regions 120. The $p^+$-type regions 108 are provided being sandwiched by the $n^+$-type regions 106 on the front surface of the p-type regions 120.

Also, among the plurality of p-type regions 120, p-type regions 120 corresponding to the FWD element 150 function as the anode region 20 explained with reference to FIG. 1 to FIG. 20B. The $n^+$-type regions 106 and the $p^+$-type regions 108 may be formed also in the p-type regions 120 corresponding to the FWD element 150.

The emitter anode electrode 124 is connected to the respective p-type regions 120. When the $n^+$-type regions 106 and the $p^+$-type regions 108 are formed in the p-type regions 120, the emitter anode electrode 124 is connected to both the $n^+$-type regions 106 and the $p^+$-type regions 108. When the $n^+$-type regions 106 and the $p^+$-type regions 108 are not formed, the emitter anode electrode 124 is connected to the p-type regions 120.

Also, the emitter anode electrode 124 and the trench gates 102 are insulated by the insulation film 122. The respective trench gates 102 are connected to a gate electrode not shown in the figure. Due to a voltage being applied to the trench gates 102, a channel in the vertical direction is formed in the p-type regions 120 between the $n^+$-type regions 106 and the semiconductor substrate 10.

The semiconductor substrate 10 comprises the FS region 40 formed on its rear surface side. The FS region 40 has the structure and characteristics which are the same as those of the FS region 40 explained with reference to FIG. 1 to FIG. 20B. Also, among regions on the rear surface of the FS region 40, in a region corresponding to the IGBT element 140, a p-type collector region 130 is formed, and in a region corresponding to the FWD element 150, the n-type cathode region 30 is formed. On the rear surfaces of the collector region 130 and the cathode region 30, the common collector cathode electrode 132 is formed.

It is effective, also in the RC-IGBT semiconductor device 200 of the present example, to control the carrier lifetime by adjusting the proton injection concentration in the FS region 40 as explained with reference to FIG. 1 to FIG. 20B.

Figure 22:
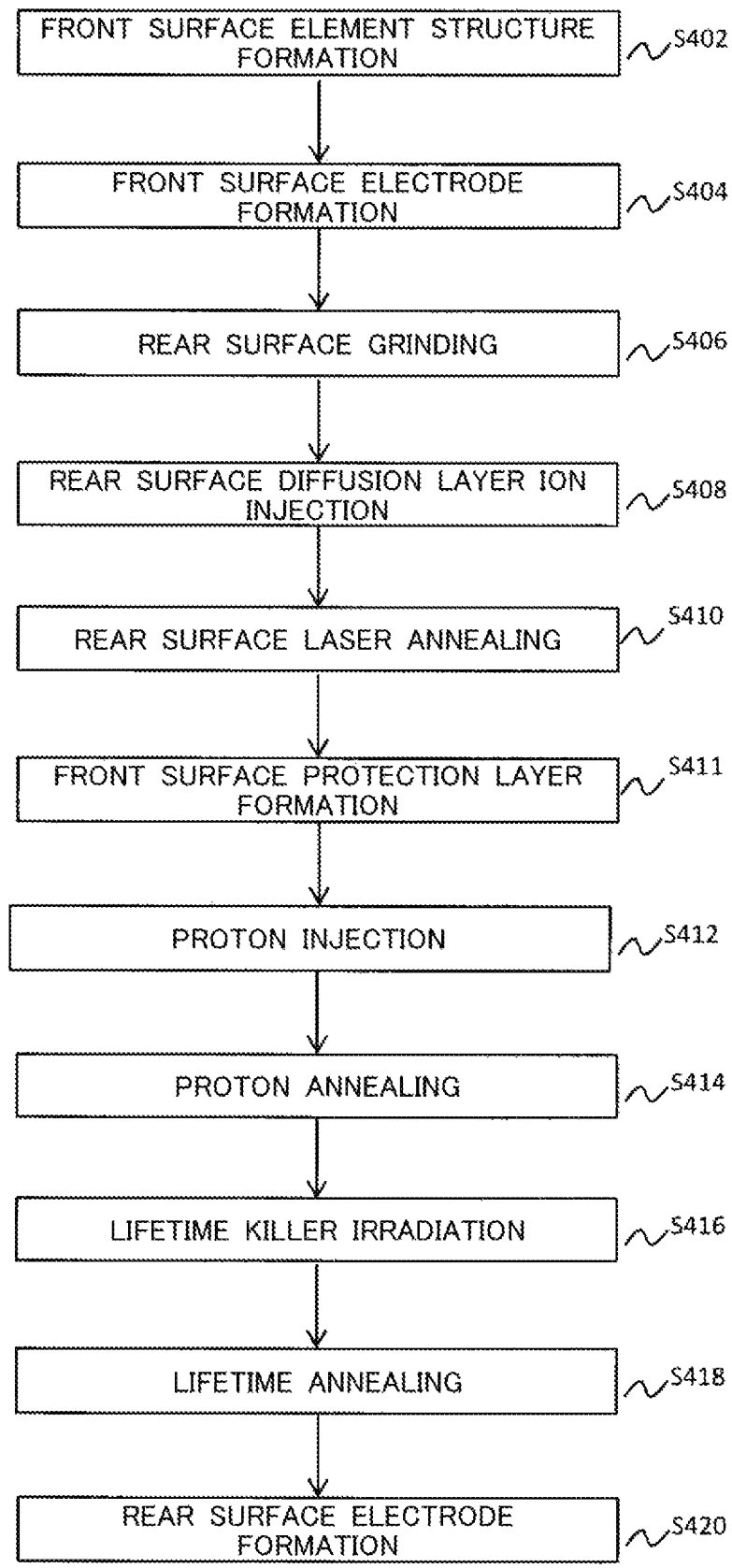
FIG. 22 shows a figure illustrating one exemplary method of manufacturing the semiconductor device 200.

FIG. 22 shows a figure illustrating one exemplary method of manufacturing the semiconductor device 200. First, the semiconductor substrate 12 is prepared in a manner similar to that in the example of FIG. 5. Next, at a front surface element structure formation step S402, the element structure of the semiconductor substrate 12 on the front surface side thereof is formed. In the present example, the p-type regions 120, the trenches 104, the $n^+$-type regions 106, the $p^+$-type regions 108, the n-type regions 110 and the insulation film 122 are formed on the front surface of the semiconductor substrate 12.

Next, at a front surface electrode formation step S404, the emitter anode electrode 124 is formed. Next, at a rear surface grinding step S406, the rear surface of the semiconductor substrate 12 is ground. Next, at a rear surface diffusion layer ion injection step S408, p-type impurity ions and n-type impurity ions are injected, respectively, into regions of the rear surface of the semiconductor substrate 10 corresponding to the collector region 130 and the cathode region 30. Next, at a rear surface laser annealing step S410, the regions to which the p-type impurity ions and the n-type impurity ions are injected are laser-annealed to form the collector region 130 and the cathode region 30. Next, at a front surface protection film formation step S411, a protection film is formed on the front surface of the semiconductor substrate 10.

Next, at a proton injection step S412 and a proton annealing step S414, the FS region 40 is formed. The proton injection step S412 and the proton annealing step S414 are the same as the proton injection step S342 and the proton annealing step S344 in FIG. 6. Thereby, the FS region 40 having the concentration distribution of protons as the one shown in FIG. 2 is formed.

Next, at a lifetime killer irradiation step S416 and a lifetime annealing step S418, the carrier lifetime is controlled. The lifetime killer irradiation step S416 and the lifetime annealing step S418 are the same as the lifetime killer irradiation step S352 and the lifetime annealing step S354 in FIG. 6. Thereby, the carrier lifetime distribution as the one shown in FIG. 3 or FIG. 9 is realized.

Then, at a rear surface electrode formation step S420, the collector cathode electrode 132 is formed. Thereby, the semiconductor device 200 is manufactured.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

Figure 23:
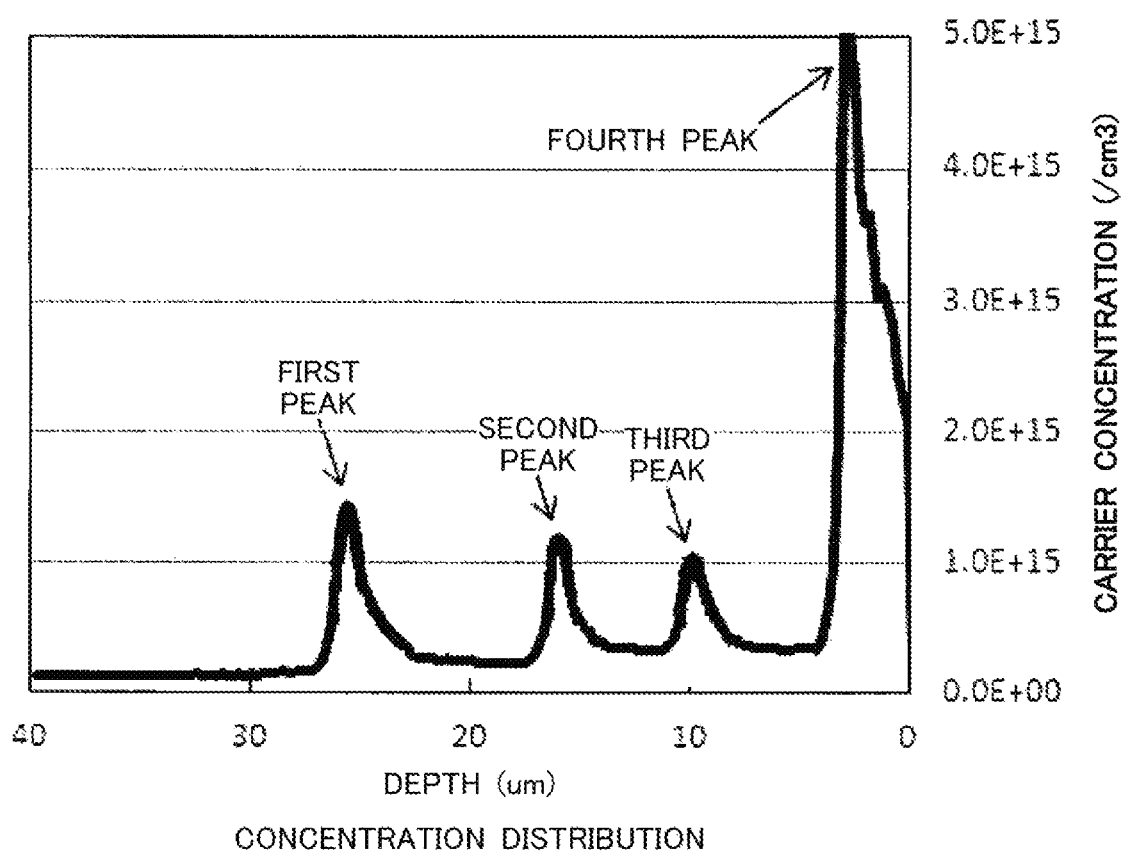
FIG. 23 shows a figure illustrating another exemplary carrier concentration distribution in the FS region 40.

FIG. 23 shows a figure illustrating another exemplary carrier concentration distribution in the FS region 40. In FIG. 23, the horizontal axis indicates the depth position within the FS region 40 from its rear surface side end portion, and the vertical axis indicates the carrier concentration. The carrier concentration corresponds to the donor concentration of protons injected into the FS region 40.

As shown in FIG. 23, the concentration distribution of the donor in the FS region 40 in its depth direction has a plurality of peaks. In the present example also, similarly to the example of FIG. 2, there are a first peak, a second peak, a third peak and a fourth peak. However, in the present example, the first to third peaks excluding the fourth peak closest to the rear surface side end portion of the FS region 40 have higher carrier concentrations as the distances from the rear surface end portion increase. That is, the carrier concentration of the first peak is higher than the carrier concentrations of the second peak and the third peak, and the carrier concentration of the second peak is higher than the carrier concentration of the third peak.

The FS region 40 prevents the depletion layer expanding from the boundary of the p$^+$-type anode region 20 and the n$^-$-type semiconductor substrate 10 from reaching the cathode region 30. The depletion layer may expand, at most, to the peak closest to the rear surface end portion among the plurality of peaks.

In the present example, the concentrations of the first to third peak decrease gradually from the substrate front surface side toward the rear surface side. Also, the lowest peak concentration is higher than that in the example of FIG. 2. For this reason, the inclination dV/dt of reverse recovery voltage can be made small.

Figure 24:
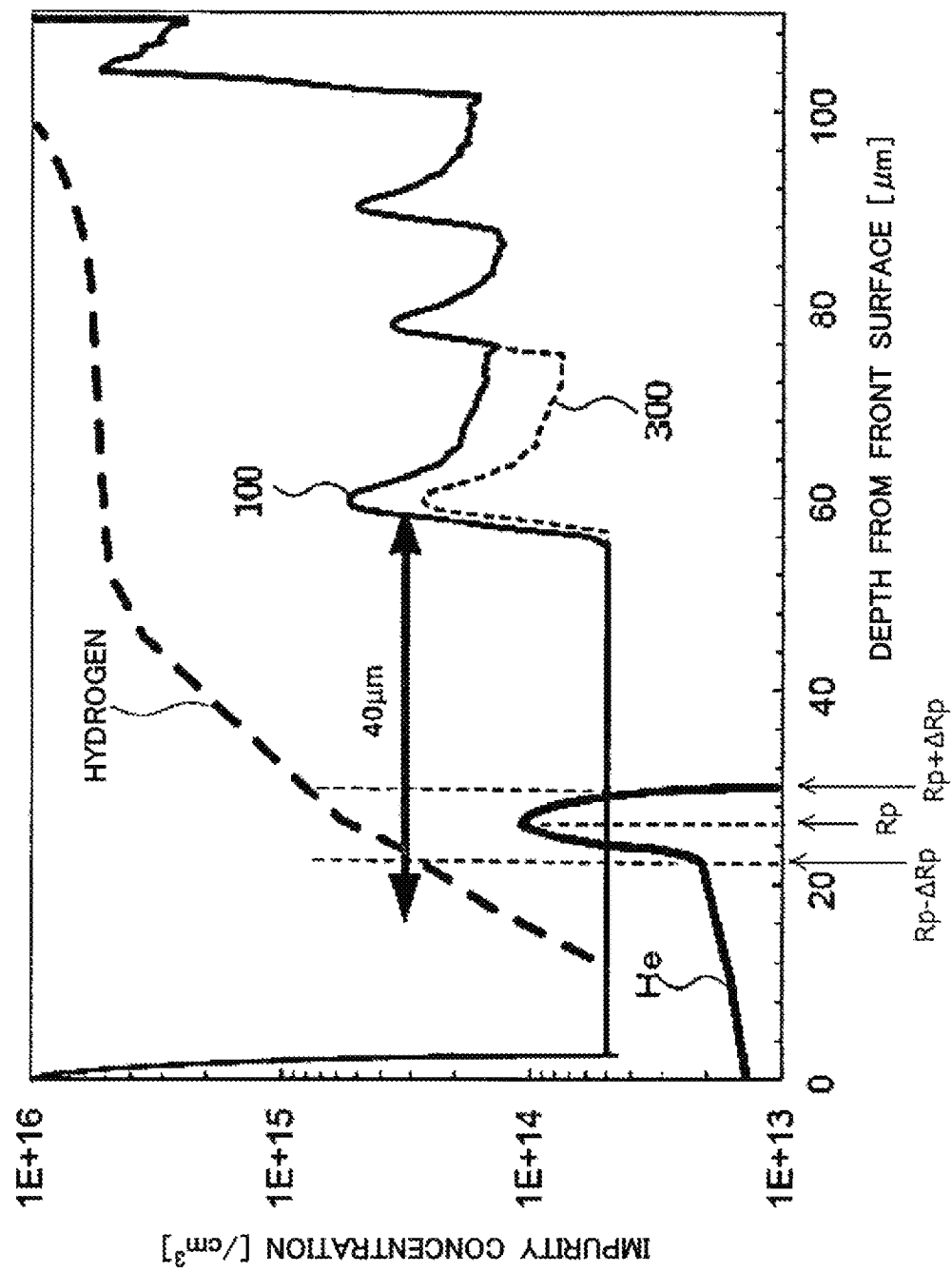
FIG. 24 shows a figure illustrating one exemplary impurity concentration distribution of the semiconductor substrate 10 in its depth direction, together with the helium distribution and hydrogen distribution.

FIG. 24 shows a figure illustrating one exemplary impurity concentration distribution of the semiconductor substrate 10 in its depth direction, together with the helium distribution and hydrogen distribution. In FIG. 24, the p-type and n-type impurity concentrations are shown together. In the present example, the p-type anode region 20 with a high concentration is formed from the front surface of the semiconductor substrate 10 to the depth of approximately several μm. An n$^-$-type region as a drift region is formed from an end portion of the anode region 20 to the depth of approximately 55 μm, and the FS region 40 and the cathode region 30 are formed to the depths of approximately 55 μm and more.

Also, in FIG. 24, the impurity concentration of a comparative example 300 is indicated with a dotted line. In the FS region 40 of the semiconductor device 100 of the present example, the peak of impurity concentration closest to the front surface of the semiconductor substrate 10 is higher than the corresponding peak in the comparative example 300.

Also, in the semiconductor device 100 of the present example, the front surface of the semiconductor substrate 10 is irradiated with helium ions in order to control the carrier lifetime on the front surface side of the semiconductor substrate 10. In the present example, the average range of helium ions is Rp, and the half-value width of the range distribution of helium ions is ΔRp.

The peak position of a range of helium ions with which the front surface of the semiconductor substrate 10 is irradiated (that is, the position of a depth Rp from the front surface of the semiconductor substrate 10) may be located within a range of 40 μm from the peak closest to the front surface of the semiconductor substrate 10 from among the peaks in the concentration distribution of the donor in the FS region 40. The distance from a peak may be measured from a position at which a donor concentration becomes a half of a maximum value of the peak on the substrate front surface side from the maximum point of the peak.

With such a configuration, a dangling bond attributable to holes generated due to irradiation with helium ions is terminated by a predetermined amount by hydrogen diffused from the peak of the FS region 40. For this reason, a leakage current attributable to helium and holes can be decreased. Also, the carrier lifetime distribution shown in FIG. 3 can be readily realized.

The half-value position Rp-ΔRp of the range distribution of helium ions may be within the range of 40 μm from the peak of the concentration distribution of the donor in the FS region 40. Thereby, a leakage current can be decreased more efficiently. However, the distribution position of helium ions is not limited to these ranges. Even if the peak position Rp of the range of helium ions is apart from the peak of the concentration distribution of the donor in the FS region 40 by 40 μm or more, a leakage current can be decreased to a certain degree, although hydrogen diffused from the peak becomes less.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCE SYMBOLS

10: semiconductor substrate, 12: semiconductor substrate, 20: anode region, 22: insulation film, 24: anode electrode, 30: cathode region, 32: cathode electrode, 40: FS region, 100: semiconductor device, 102: trench gate, 103: insulation film, 104: trench, 106: n$^+$-type region, 108: p$^+$-type region, 110: n-type region, 120: p-type region, 122: insulation film, 124: emitter anode electrode, 130: collector region, 132: collector cathode electrode, 140: IGBT element, 150: FWD element, 200: semiconductor device, 300: comparative example

What is claimed is:

1. A semiconductor device comprising:
an n-type semiconductor substrate;
a p-type semiconductor region formed in a front surface side of the semiconductor substrate; and
an n-type field stop region that is formed in a rear surface side of the semiconductor substrate, the n-type field stop region including protons as a donor; wherein
a concentration distribution of the donor in the field stop region in a depth direction has a plurality of peaks including a first peak, a second peak that is closer to the rear surface of the semiconductor substrate than the first peak is, a third peak that is closer to the rear surface of the semiconductor substrate than the second peak is, and a fourth peak that is closer to the rear surface of the semiconductor substrate than the third peak is,
each of the plurality of peaks including the first peak, the second peak, the third peak and the fourth peak has a peak maximum point, and peak end points formed at both sides of the peak maximum point, and
the peak maximum point of the third peak is lower than the peak maximum point of the fourth peak.

2. The semiconductor device according to claim 1, wherein the peak end points are points at which inclination becomes substantially zero.

3. The semiconductor device according to claim 2, wherein
a concentration difference between the peak end points formed at both sides of the peak maximum point of the first peak is larger than a concentration difference between the peak end points formed at both sides of the peak maximum point of the second peak, and
the concentration difference between the peak end points formed at both sides of the peak maximum point of the first peak is larger than a concentration difference between the peak end points formed at both sides of the peak maximum point of the third peak.

4. The semiconductor device according to claim 2, wherein
a concentration of a second peak end point of the first peak that is closer to the rear surface of the semiconductor substrate than a first peak end point of the first peak is, concentrations of the peak end points formed at both sides of the peak maximum point of the second peak, and concentrations of the peak end points formed at both sides of the peak maximum point of the third peak are predetermined concentrations that are substantially the same as each other, and
a concentration of the first peak end point of the first peak is lower than the predetermined concentrations.

5. The semiconductor device according to claim 4, wherein
a concentration of a first peak end point of the fourth peak that is closer to the front surface of the semiconductor substrate than a second peak end point of the fourth peak is, is substantially the same as the predetermined concentrations.

6. The semiconductor device according to claim 5, wherein
the predetermined concentrations are substantially equal to $2\times10^{14}/cm^3$.

7. The semiconductor device according to claim 6, wherein
the concentration of the first peak end point of the first peak is substantially equal to $6\times10^{13}/cm^3$.

8. The semiconductor device according to claim 2, wherein
each of the first peak, the second peak, the third peak and the fourth peak is a peak that rises from a baseline,
a first portion of the baseline is substantially constant between the first peak and the second peak,
a second portion of the baseline is substantially constant between the second peak and the third peak, and
a third portion of the baseline is substantially constant between the third peak and the fourth peak.

9. The semiconductor device according to claim 8, wherein
a fourth portion of the baseline of the first peak is lower than the first portion of the baseline between the first peak and the second peak,
the fourth portion of the baseline of the first peak is lower than the second portion of the baseline between the second peak and the third peak, and
the fourth portion of the baseline of the first peak is lower than the third portion of the baseline between the third peak and the fourth peak.

10. The semiconductor device according to claim 9, wherein
the first portion of the baseline between the first peak and the second peak, the second portion of the baseline between the second peak and the third peak, and the third portion of the baseline between the third peak and the fourth peak substantially have a concentration of $2\times10^{14}/cm^3$.

11. The semiconductor device according to claim 10, wherein
the fourth portion of the baseline of the first peak substantially has a concentration of $6\times10^{13}/cm^3$.

12. The semiconductor device according to claim 3, further comprising
an n-type cathode region formed in the semiconductor substrate closer to the rear surface side of the semiconductor substrate than the field stop region is, wherein
the p-type semiconductor region is an anode region.

13. The semiconductor device according to claim 12, wherein
the fourth peak is a peak from among the plurality of peaks that is closest to the rear surface of the semiconductor substrate.

14. The semiconductor device according to claim 12, wherein
the fourth peak is a peak from among the plurality of peaks that is closest to the rear surface of the semiconductor substrate, and
the second peak is adjacent to both the first peak and the third peak, and the third peak is adjacent to both the second peak and the fourth peak.

15. The semiconductor device according to claim 14, wherein
among the plurality of peaks, at least some of the peak maximum points are provided at regular intervals in the field stop region in the depth direction.

16. The semiconductor device according to claim 14, wherein
a thickness of the semiconductor substrate is 100 to 130 μm.

17. The semiconductor device according to claim 14, wherein
a peak closest to the front surface of the semiconductor substrate from among the plurality of peaks is positioned substantially 30 μm from the rear surface of the semiconductor substrate.

18. The semiconductor device according to claim 1, wherein
   the peak maximum point of the third peak is higher than the peak maximum point of the second peak.

19. The semiconductor device according to claim 1, wherein
   the peak maximum point of the third peak is higher than the peak maximum point of the first peak.

20. The semiconductor device according to claim 1, wherein
   the peak maximum point of the third peak is higher than the peak maximum points of the first peak and the second peak.

\* \* \* \* \*